: US 8,917,896 B2
(45) Date of Patent: *Dec. 23, 2014

(12) United States Patent
Ickler et al.

(54) AUTOMATED CUSTOMIZATION OF LOUDSPEAKERS

(75) Inventors: Christopher B. Ickler, Sudbury, MA (US); Clifford A. Henricksen, Framingham, MA (US); Akira Mochimaru, Natick, MA (US); Kenneth D. Jacob, Framingham, MA (US); Soichiro Hayashi, Framingham, MA (US)

(73) Assignee: Bose Corporation, Framingham, MA (US)

( * ) Notice: Subject to any disclaimer, the term of this patent is extended or adjusted under 35 U.S.C. 154(b) by 1325 days.

This patent is subject to a terminal disclaimer.

(21) Appl. No.: 12/557,885

(22) Filed: Sep. 11, 2009

(65) Prior Publication Data

US 2011/0064247 A1 Mar. 17, 2011

(51) Int. Cl.
  *H04R 1/20* (2006.01)
  *H04R 1/30* (2006.01)
  *G10K 11/02* (2006.01)

(52) U.S. Cl.
  CPC .............. *H04R 1/30* (2013.01); *G10K 11/025* (2013.01)
  USPC ........... 381/341; 381/150; 381/182; 381/337; 381/340; 381/342

(58) Field of Classification Search
  USPC ................ 381/117, 182, 82, 150, 335–342
  See application file for complete search history.

(56) References Cited

U.S. PATENT DOCUMENTS

| 2,089,391 | A | 8/1937 | Marion |
| 3,234,559 | A | 2/1966 | Bartholoma |
| 3,977,006 | A | 8/1976 | Miersch |
| 4,171,734 | A | 10/1979 | Peveto et al. |
| 4,308,932 | A | 1/1982 | Keele, Jr. |
| 4,344,504 | A | 8/1982 | Howze |
| 4,629,029 | A | 12/1986 | Gunness |
| 4,845,759 | A | 7/1989 | Danley |
| 4,882,562 | A | 11/1989 | Andrews et al. |
| 4,969,196 | A | 11/1990 | Nakamura |

(Continued)

FOREIGN PATENT DOCUMENTS

| CN | 1496552 A | 5/2004 |
| CN | 201290172 Y | 8/2009 |

(Continued)

OTHER PUBLICATIONS

International Search Report and Written Opinion dated Feb. 14, 2011 for PCT/US10/045571.

(Continued)

*Primary Examiner* — Paul S Kim

(57) ABSTRACT

A loudspeaker includes a horn including a first end panel, a second end panel, a first side panel, and a second side panel. Edges of at least the first and second side panels define a diffraction slot opening. The first and second side panels are each fabricated from a sheet of flexible material held in a stressed, curved shape by at least a rigid support member. The panels are designed by an automated process based on a number of electro-acoustic transducers to be used in a loudspeaker, horizontal and vertical coverage angles for the loudspeaker, and a wall length for a horn of the loudspeaker.

18 Claims, 18 Drawing Sheets

(56) References Cited

U.S. PATENT DOCUMENTS

| | | | |
|---|---|---|---|
| 5,325,439 | A | 6/1994 | Smiley |
| 5,526,456 | A | 6/1996 | Heinz |
| 5,590,214 | A | 12/1996 | Nakamura |
| 5,715,322 | A | 2/1998 | Yoshioka et al. |
| 5,750,943 | A | 5/1998 | Heinz |
| 5,925,856 | A | 7/1999 | Meyer et al. |
| 6,009,182 | A | 12/1999 | Gunness |
| 6,059,069 | A | 5/2000 | Hughes |
| 6,112,847 | A | 9/2000 | Lehman |
| 6,116,373 | A * | 9/2000 | Dodd .................. 181/152 |
| 6,343,133 | B1 | 1/2002 | Adamson |
| 6,393,131 | B1 * | 5/2002 | Rexroat ................ 381/342 |
| 6,394,223 | B1 | 5/2002 | Lehman |
| 6,581,719 | B2 | 6/2003 | Adamson |
| 6,668,969 | B2 | 12/2003 | Meyer et al. |
| 6,712,177 | B2 | 3/2004 | Ureda |
| 6,744,899 | B1 | 6/2004 | Grunberg |
| 6,950,530 | B2 | 9/2005 | Baird et al. |
| 7,044,265 | B2 | 5/2006 | Murphy |
| 7,177,437 | B1 | 2/2007 | Adams |
| 7,236,606 | B2 | 6/2007 | Werner |
| 7,275,621 | B1 | 10/2007 | Delgado, Jr. |
| 7,278,513 | B2 | 10/2007 | Brawley, Jr. |
| 7,299,893 | B2 | 11/2007 | Meyer et al. |
| 7,392,880 | B2 | 7/2008 | Buck |
| 7,454,029 | B2 | 11/2008 | Andrews |
| 7,590,257 | B1 | 9/2009 | Blanchard et al. |
| 7,708,112 | B2 | 5/2010 | Geddes |
| 2001/0040974 | A1 | 11/2001 | Steckling |
| 2002/0014368 | A1 * | 2/2002 | Adamson ............ 181/182 |
| 2002/0038740 | A1 | 4/2002 | Ureda |
| 2002/0150270 | A1 | 10/2002 | Werner |
| 2003/0133584 | A1 | 7/2003 | Werner |
| 2003/0188920 | A1 | 10/2003 | Brawley |
| 2003/0219139 | A1 | 11/2003 | Baird et al. |
| 2004/0005069 | A1 | 1/2004 | Buck |
| 2004/0245043 | A1 | 12/2004 | Noselli et al. |
| 2005/0217927 | A1 | 10/2005 | Noselli et al. |
| 2006/0169530 | A1 | 8/2006 | Noselli et al. |
| 2007/0086615 | A1 | 4/2007 | Cheney |
| 2007/0102232 | A1 | 5/2007 | Geddes |
| 2007/0223713 | A1 | 9/2007 | Gunness |
| 2008/0059132 | A1 | 3/2008 | Zander et al. |
| 2008/0085026 | A1 | 4/2008 | Engebretson et al. |

FOREIGN PATENT DOCUMENTS

| | | | |
|---|---|---|---|
| DE | 202005020757 | U1 | 7/2006 |
| EP | 0880300 | A2 | 11/1998 |
| EP | 1178702 | A2 | 2/2002 |
| EP | 1330936 | A1 | 7/2003 |
| EP | 1333698 | A2 | 8/2003 |
| EP | 1686830 | A1 | 8/2006 |
| JP | S4869325 | U | 12/1971 |
| JP | 60-081999 | A | 5/1985 |
| JP | H04505241 | A | 9/1992 |
| JP | H06078389 | A | 3/1994 |
| JP | 9139993 | A | 5/1997 |
| WO | 9911098 | A1 | 3/1999 |
| WO | 0225991 | A1 | 3/2002 |
| WO | 02074030 | A1 | 9/2002 |
| WO | 03030583 | A2 | 4/2003 |
| WO | 03061342 | A1 | 7/2003 |
| WO | 03086016 | A1 | 10/2003 |
| WO | 03088206 | A2 | 10/2003 |
| WO | 2006088380 | A1 | 8/2006 |
| WO | 2007054709 | A2 | 5/2007 |
| WO | 2008112175 | A1 | 9/2008 |
| WO | 2011031415 | A1 | 3/2011 |

OTHER PUBLICATIONS

Anonymous: Mapp Online Pro 2.8 User Guide, Meyer Sound. Retrieved from the Internet on Jan. 26, 2011: http:/ www.meyersound.com/products/mapponline/pro/pdfs/mapppro_ug_2.8.54.pdf.

Johansen: On the Directivity of Horn Loudspeakers, Journal of the Audio Engineering Society, vol. 42, No. 12, Dec. 1994.

International Search Report and Written Opinion dated Dec. 14, 2011 for PCT/US2011/053635.

Prohs J R et al: "An Accurate and Easily Implemented Method of Modeling Loudspeaker Array Coverage", Journal of the Audio Engineering Society, Audio Engineering Society, New York, NY, US, vol. 32, No. 4, Apr. 1, 1984, pp. 204-217, XP000763028, ISSN: 1549-4950 * the whole document *.

Extended European Search Report dated Jan. 23, 2013 for Application No./Patent No. 12156119.5-2225/ 2493210.

First Japanese Office Action dated May 21, 2013 for JP Application No. 2012-528804 with English translation.

Australian Patent Examination Report No. 1 dated Mar. 22, 2013 for AU Application No. 2010292825.

International Preliminary Report on Patentability dated Apr. 9, 2013 for PCT/US2011/053635.

Engebretson, Mark, QSC White Paper, Advanced Loudspeaker Tuning Techniques QSC Intrinisc Correction, Dated Sep. 7, 2007, 12 pages.

Saraceno, Steven. Eastern Acoustic Works, Loudspeaker Enclosures Materials and Manufacturing Technology, One Main Street, Whitinsville, MA 01588, http://www.eaw.com, 4 pages.

Ureda, Mark S. Audio Engineering Society Convention Paper 5304 Presented at the 110th Convention May 12-15 2001 Amsterdam, The Netherlands, Line Arrays: Theory and Applicatiohns, 12 pages.

Ureda, Mark S. Audio Engineering Society Convention Paper Presented at the 111th Convention 2001 Sep. 21-24, New York, NY, USA, 10 pages.

Geo Innovation Analysis, Nexo, Reflective Wavesource Technology Using Geometrical Transformation of Conicoids, Geo Reflective Wavesource Technology, 26 pages, Jul. 15, 2002.

Geo Application Analysis from the innovators of NEXO, Coincoid Reflective Wavesource Technology and Tangent Array Design & Applications, Audio reproduction for live audiences: success criteria., 18 pages, Jul. 15, 2002.

Ureda, Mark S. Analysis of Loudspeaker Line Arrays, JBL Professional Northbridge, CA 91329, USA, J. Audio Eng. Soc., vol. 52, No. 5, May 2004, pp. 467-495.

Invitation to Pay Additional Fees dated Oct. 5, 2010 for PCT/US10/045571.

NEXO Innovation Analysis, GEO Reflective Wavesource Technology, Jun. 16, 2002.

VRX932LA-JBL VRX932LA-1, 12" Two-Way Constant Curvature Line Array, Northridge, California 91329 U.S.A., 2007.

English translation of First Chinese Office Action dated Mar. 5, 2014 for CN Application No. 201210097445.7.

First Chinese Office Action dated Mar. 5, 2014 for CN Application No. 201210097445.7.

First Chinese Office Action dated Feb. 8, 2014 for CN Application No. 201080039314.2.

English translation of First Chinese Office Action dated Feb. 8, 2014 for CN Application No. 201080039314.2.

* cited by examiner

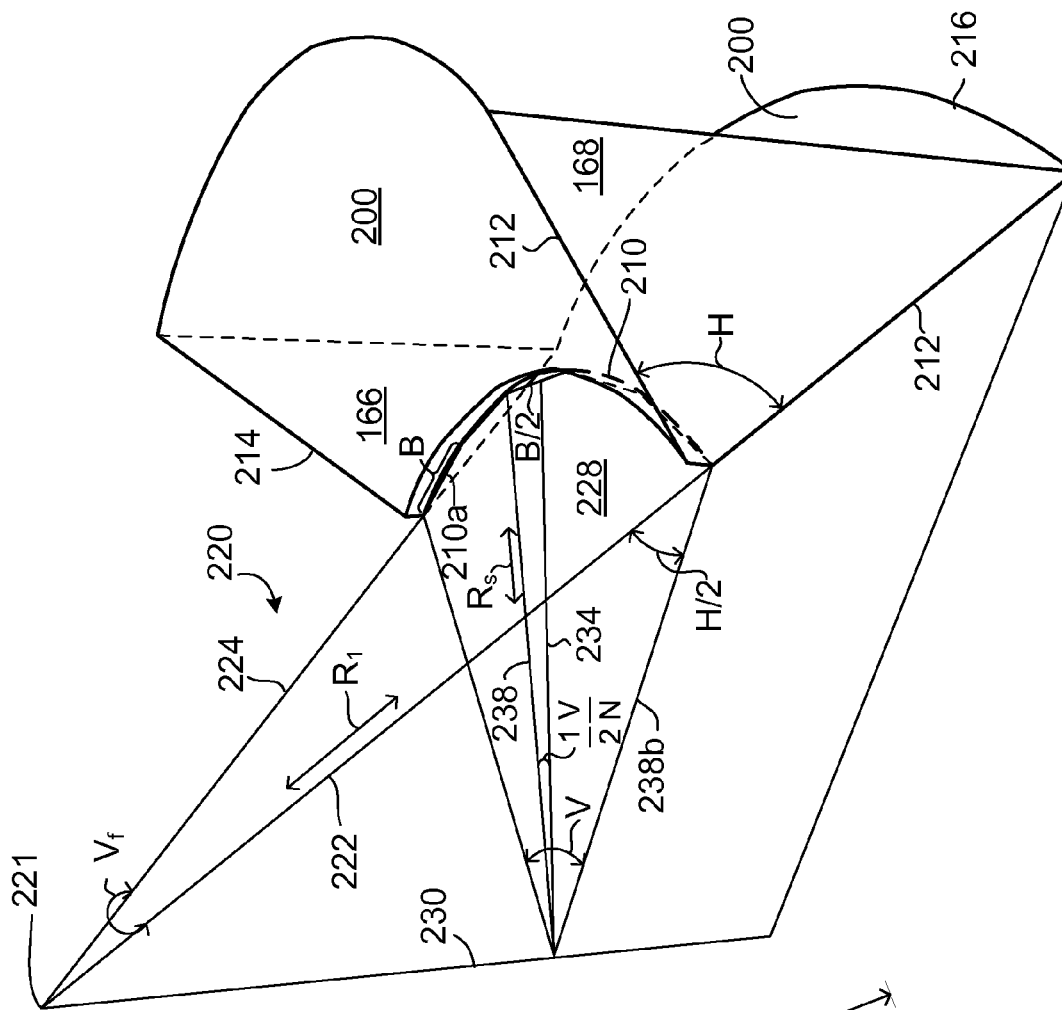
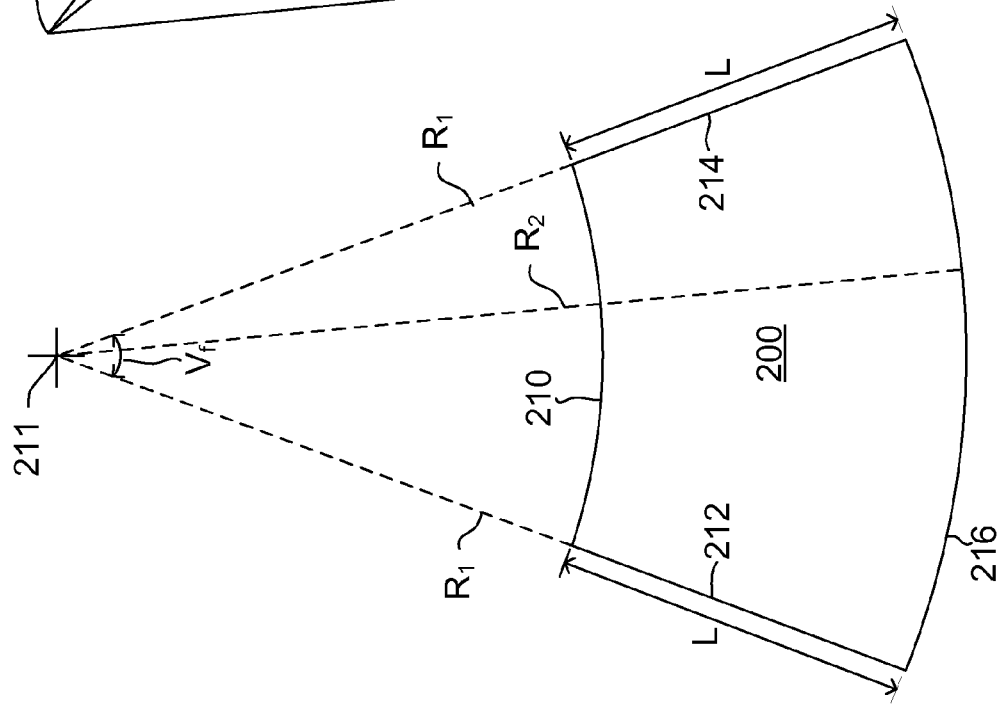
Fig. 6B
Fig. 6A

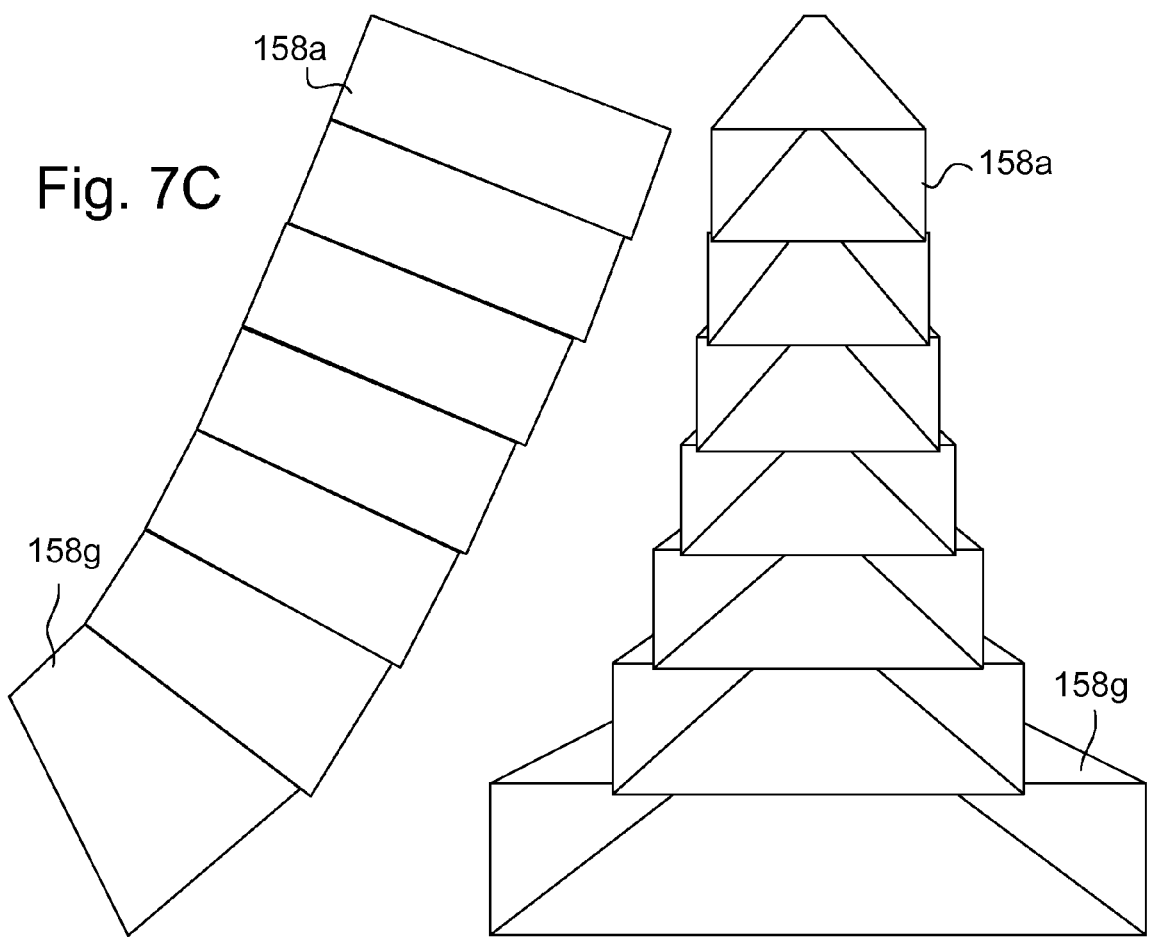
Fig. 7C
Fig. 7D
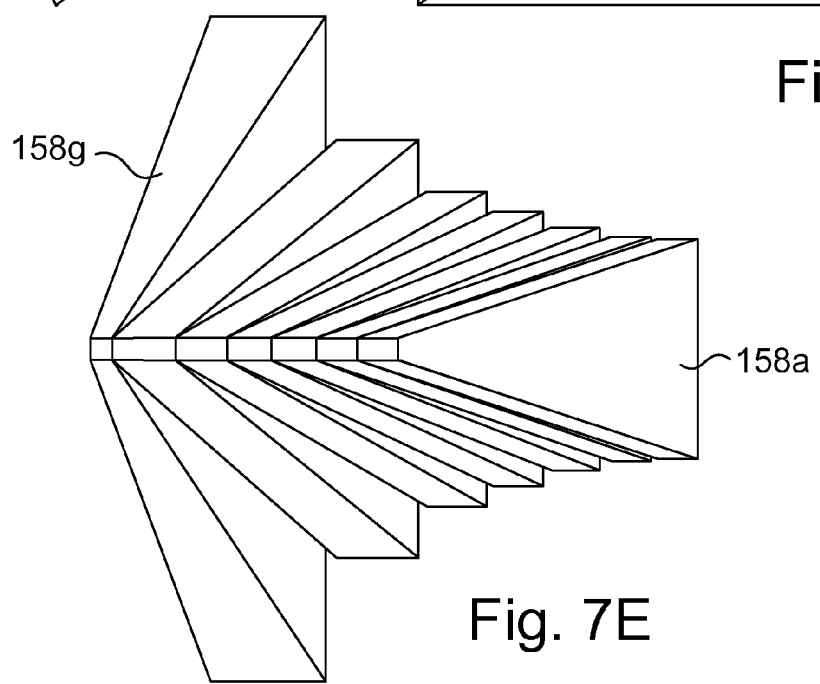
Fig. 7E

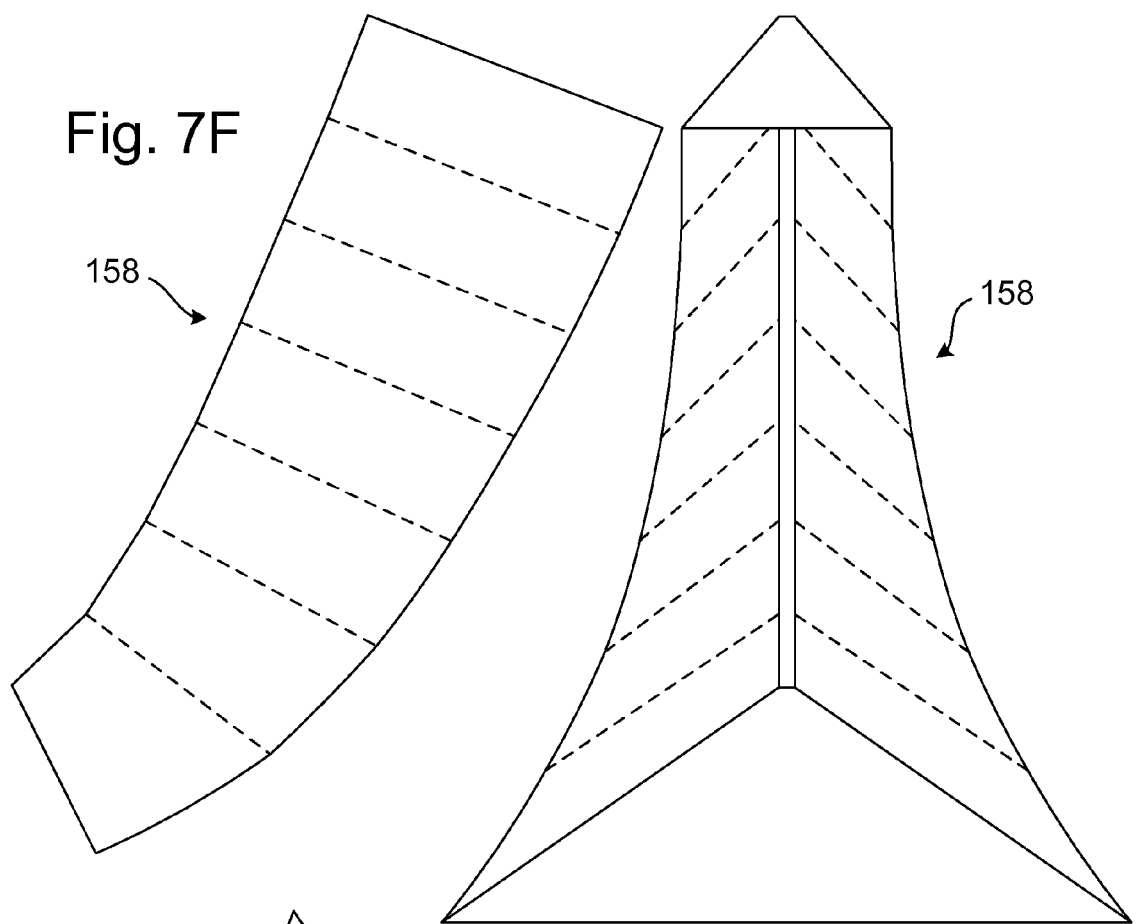
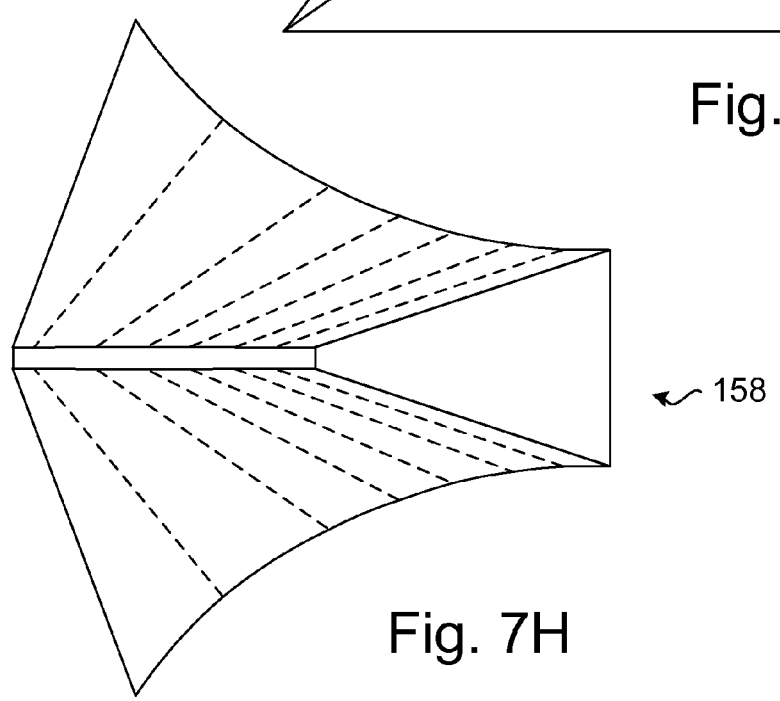
Fig. 7F
Fig. 7G
Fig. 7H

AUTOMATED CUSTOMIZATION OF LOUDSPEAKERS

BACKGROUND

This disclosure relates to automated customization of loudspeakers.

Audio reproduction systems for large venues typically use arrays of modular loudspeakers to produce the level and distribution of sound energy necessary to fill the venue with sound. In some examples, one-off custom loudspeakers that attempt to fill a portion of the venue with a single loudspeaker may be fabricated based on a designer's estimate of the proper dimensions for such a loudspeaker.

SUMMARY

In general, in some aspects, a loudspeaker includes a horn including a first end panel, a second end panel, a first side panel, and a second side panel. Edges of at least the first and second side panels define a diffraction slot opening. The first and second side panels are each fabricated from a sheet of flexible material held in a stressed, curved shape by at least a rigid support member.

Implementations may include one or more of the following features. The first and second end panels each include a rigid sheet material. The diffraction slot opening has a convex curvature relative to the inside of the horn. The side panels are curved in a direction corresponding to the diffraction slot opening while remaining straight in a direction perpendicular to the slot opening. The curved shapes of the first and second side panels each have dimensions corresponding to a section of a right circular conical surface. The conical surface section is bounded by a first circular arc of a first radius, a second circular arc of a second radius, and straight edges collinear with lines on the conical surface that intersect an end of each of the first and second circular arcs and the apex of the cone. The conical surface section is bounded by a first circular arc of a first radius, a second arc of a varying radius, and straight edges collinear with lines on the conical surface that intersect an end of each of the first and second arcs and the apex of the cone. The first and second side panels have dimensions when flat corresponding to a section of a planar annulus defined by an inner radius, an outer radius, and an angle. The first and second side panels each vary in length and curvature along the extent of the slot opening. The first and second side panels each include a first edge, and the first edges of the side panels are each coupled to the rigid support member under tension and without fasteners along the length of the first edge. The first edges of the side panels are each coupled to the rigid spine member at an angle that varies along the length of the first edge.

The loudspeaker includes a plurality of manifold components, each having an output opening coupled to the diffraction slot opening, the output openings of the plurality of manifold components together constituting a diffraction slot source at the diffraction slot opening; and a plurality of electro-acoustic transducers, each coupled to an input opening of one of the manifold components. The manifold components each have two input openings and include two acoustic passages, each of the acoustic passages having a first end at a different one of the two input openings and a second end at the output opening, and the acoustic passages each curving away from the output opening in a different direction, such that the input openings are located near opposite sides of the horn. The manifold components each have one input opening and include one acoustic passage having a first end at the input opening and a second end at the output opening, the acoustic passage of each manifold component curving away from the output opening in a direction opposite that of the neighboring manifold components' acoustic passages, such that the input opening is located near the opposite side of the horn from the neighboring manifold components' input openings.

In general, in some aspects, a process obtains loudspeaker data identifying a number of electro-acoustic transducers to be used in a loudspeaker, horizontal and vertical coverage angles for the loudspeaker, and a wall length for a horn of the loudspeaker. The process computes a curvature of a diffraction slot of the loudspeaker having a length based on the number of transducers, defines top and bottom end panels of the horn of the loudspeaker corresponding to the vertical coverage angle, defines first and second side walls of the horn having lengths, widths, and curvatures based on the number of transducers, the horizontal and vertical coverage angles, and the curvature of the diffraction slot, computes dimensions of flat panels corresponding to the defined first and second side walls, and outputs machine-readable plans for fabrication of the top and bottom end panels and the first and second side walls.

Implementations may include one or more of the following features. Flat panels are fabricated based on the output plans, and assembled to form the horn. Fabricating the flat panels includes inputting the plans to a CNC milling machine, and operating the CNC milling machine to cut panels of thin flexible material according to the plans. The thin flexible material includes PVC. Assembling the flat panels to form the horn includes securing first and second edges of each of the side wall panels to first and second edges of the top and bottom end panels, and bending the side wall panels to conform a third edge of each of the side wall panels to the computed curvature. Bending the side wall panels includes securing a first one of the top or bottom end panel to a first end of a curved support structure corresponding to the computed curvature, and drawing the other of the top or bottom end panel toward a second end of the curved support structure, such that the third edges of each of the side wall panels each seat in a groove in the curved support structure.

A keel including a curved support structure corresponding to the computed curvature is assembled. A plurality of manifold components are fixed to the support structure, each having an output opening positioned within the support structure, where the output openings of the plurality of manifold components together form a diffraction slot source. A plurality of electro-acoustic transducers are each fixed to one of the manifold components, each transducer coupled to an input opening of the corresponding manifold component. The keel is coupled to a horn, fabricated according to the plans, such that the diffraction slot source is coupled a diffraction slot opening in the horn defined by edges of at least the first and second side panels.

Defining the first and second side walls includes computing a radius $R_1$ of an inner circumference of an annulus, a radius $R_2$ of an outer circumference of the annulus, and an angle $V_f$ of a section of the annulus, the side walls each corresponding to a section of the annulus bounded by the computed angle. The radius $R_1$ is computed by applying the formula $$R_1 = \frac{B}{2\sin\left(\frac{1}{2}\frac{V}{N}\right)\cos(H/2)},$$

where B is a dimension of one of the transducers, H is an angle between planes connecting the location of the loudspeaker to sides of the coverage area, V is an angle between planes connecting the location of the loudspeaker to the front and back of the coverage area, and N is the number of transducers. The radius $R_2$ is computed by applying the formula $R_2=R_1+L$, where L is the length of the horn. The angle $V_f$ is computed by applying the formula $V_f=V \cos(H/2)$, where H is an angle between planes connecting the location of the loudspeaker to sides of the coverage area, and V is an angle between planes connecting the location of the loudspeaker to the front and back of the coverage area.

Defining the first and second side walls includes modeling a set of sub-horns each corresponding to a section of the diffraction slot and shaped to confine acoustic energy radiated by the section of the diffraction slot to a corresponding section of the coverage area, and deforming and joining side walls of adjacent pairs of the trapezoidal sub-horns to define contiguous curved sheets spanning all of the sub-horns. Each of the sections of the coverage area corresponds to a projected area perpendicular to a direction of radiation from the corresponding section of the diffraction slot to the section, all of the projected areas having substantially the same area. The curvature of the diffraction slot includes a circular arc. The curvature of the diffraction slot includes a curve having a progressively decreasing radius. Defining the side walls includes modifying the curvatures of the side walls based on data describing material properties of the side walls.

Obtaining the loudspeaker data includes receiving input data describing a venue, a location for the loudspeaker in the venue, a coverage area within the venue, and a sound pressure level associated with the coverage area. The number of electro-acoustic transducers to be used in the loudspeaker, the horizontal and vertical coverage angles, and the length of the horn are all determined from the input data.

Determining the number of transducers includes receiving the number of transducers as input from a user. Determining the number of transducers includes computing an amount of acoustic power necessary to provide the sound pressure level over the coverage area from the loudspeaker location, and dividing the computed amount of acoustic power by a power capacity of a model of transducer. Computing the curvature of the diffraction slot includes: (a) dividing the coverage area into a plurality of strips corresponding to the number of transducers, (b) locating a first modeled source having a length and an axis with a first end of its length on a plane joining the loudspeaker location to the back of the coverage area and its axis pointed at a central position in a first of the plurality of strips associated with the rear of the coverage area, (c) locating a next modeled source having a length and an axis with a first end of its length coincident with a second end of the first modeled source's length and its axis pointed at a central position in a next of the plurality of strips adjacent to the first of the plurality of strips, and (d) repeating step (c) to position additional modeled sources relative to each preceding modeled source until the total number of modeled sources equals the determined number of electro-acoustic transducers, the curvature of the diffraction slot being a curve joining all of the modeled sources.

Advantages include providing a single integrated system that provides a specified acoustic coverage for a particular venue, including at least partially-automated design and fabrication of custom loudspeaker components.

Other features and advantages will be apparent from the description and the claims.

BRIEF DESCRIPTION OF THE DRAWINGS

FIGS. 5A, 5B, and 6A show flat panels used in constructing a loudspeaker horn.

FIGS. 6B and 6C show a conic section used in defining the flat panel of FIG. 6A.

FIG. 7C shows a side elevation of an intermediate model of a loudspeaker horn.

FIG. 7D shows a front elevation of the intermediate model of FIG. 7C.

FIG. 7E shows a plan view of the intermediate model of FIG. 7C.

FIG. 7F shows a side elevation of a model of a loudspeaker horn.

FIG. 7G shows a front elevation of the model of FIG. 7F.

FIG. 7H shows a plan view of the model of FIG. 7F.

DESCRIPTION

Figure 1:
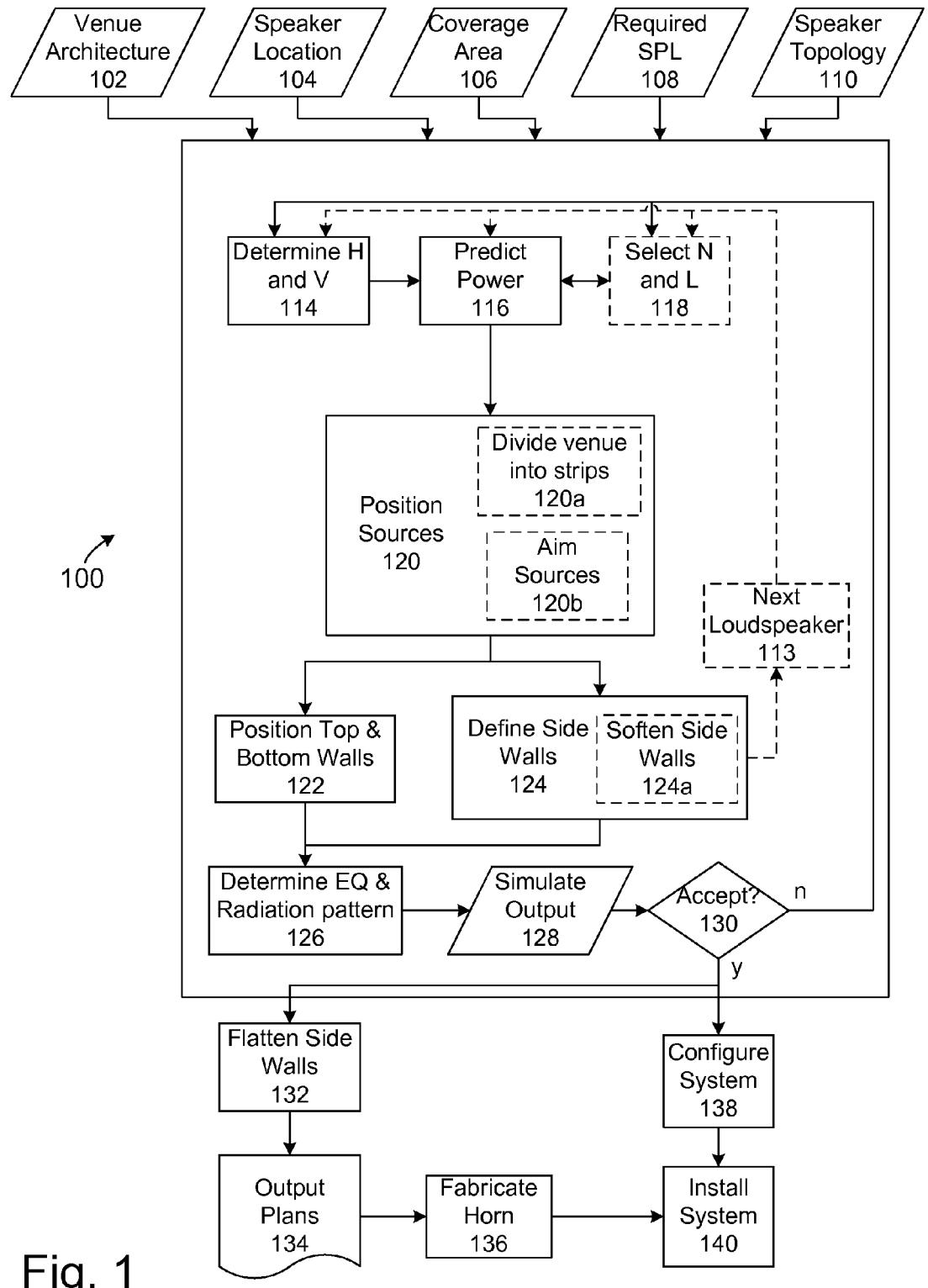
FIG. 1 shows a process for designing a custom loudspeaker.
Figure 2:
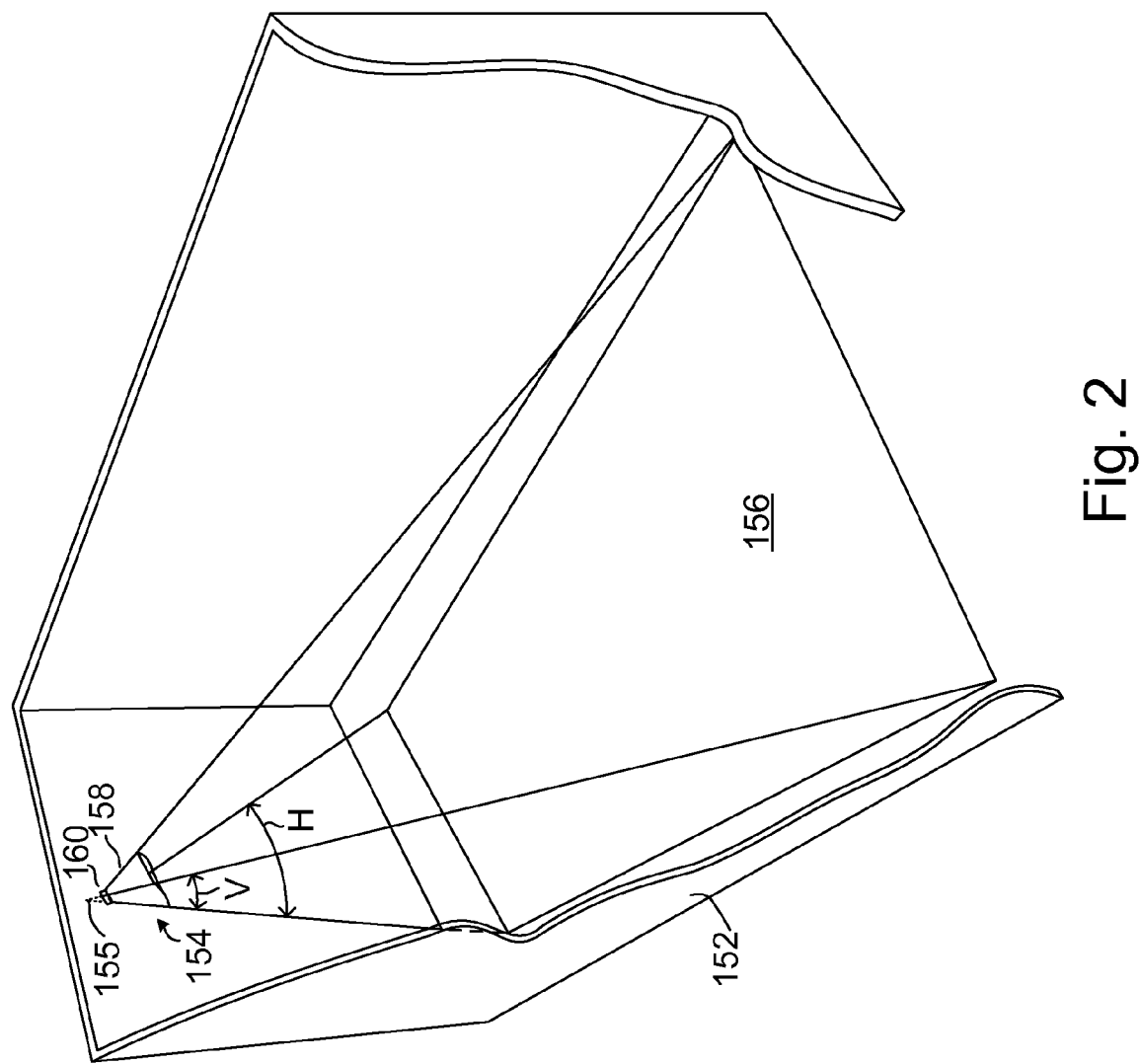
FIG. 2 shows a perspective view of a model of a loudspeaker in a venue.

An automated loudspeaker design system uses a process such as that shown in FIG. 1. In using the system, a user begins with an architectural model of the venue, and enters design goals, such as the speaker locations, the listening area, the desired bandwidth of the sound, and the sound level to be achieved. A simplified representation of a venue is shown in FIG. 2. The system uses the input parameters to design a custom loudspeaker that will meet the specified design goals. In some examples, the system goes on to supplement the custom loudspeaker with additional components, such as bass loudspeakers, amplifiers, and controllers. The system may also determine configuration parameters for those components, such as equalization curves, connection topologies, time delays, and output limits.

In the automated loudspeaker design process 100 of FIG. 1, the user begins by inputting (102) an architectural model of the venue, represented as a simple rectangular room 152 in FIG. 2. This may be done by loading a file output from architectural design or CAD software or by using a user interface provided by the system to create a model of the venue. One such system is described in U.S. patent application Ser. No. 10/964,421, filed Oct. 13, 2004, and incorporated here by reference. Next, the user specifies (104) where one or more loudspeaker 154 will be located within the venue. By "loudspeaker," we refer to the complete assembly of active electro-acoustic transducers and passive components such as waveguides, ports, and horns that work together to deliver sound to the venue. In FIG. 2, one loudspeaker 154 is shown as a generally trapezoidal box corresponding to the horn, the most visible part of the loudspeaker. Generally, there is a limited choice of where to locate the loudspeakers, due to architecture, aesthetics, or other considerations. In some examples, the automated portions of the system may specify one or more locations for the loudspeakers. The user also specifies (106, 108) the listening area 156 and sound pressure level (SPL) required of the sound system over the listening area. In some examples, the user specifies (110) the topology of a loudspeaker, e.g., whether it will be an exponential horn, a line array with an arc, progressive (spiral), or J-shaped curve, or some other topology. The system described is particularly well-suited to loudspeakers having elongated diffraction slot sources with a continuously curved shape, i.e., a circular curvature or a progressive curve, coupled to a large horn or waveguide. Selection of the loudspeaker topology may also be automated, with the system selecting the best topology to provide the required coverage. Other user inputs (not shown) may include the bandwidth or type of sound to be produced (e.g., music or voice), identification of multiple zones of coverage, or types of audio signal input sources, to name a few examples.

Given these inputs, the system begins to design (112) the first (if more than one) loudspeaker, which consists of a source 160 and a horn 158. As a first step, the system determines (114) initial approximations for the horizontal coverage angle H and vertical coverage angle V over which the loudspeaker will need to project sound to cover the listening area 156. H and V are determined geometrically from the dimensions of the listening area and the location of the loudspeaker. In FIG. 2, due to the unequal length and width of the diffraction slot source 160, V is measured between the top and bottom walls of the horn, based on a projection of those surfaces to their intersection at a hypothetical point source 155 located behind the actual loudspeaker 154, while H is measured from the intersection of projections of the side walls, just behind the back edge of the horn. The vertical coverage angle V is the angle between planes connecting the vertical point source location to the front and back rows of the listening area. The horizontal coverage angle H is the angle between planes connecting the diffraction slot source to the right and left sides of the seating area. As described below, the values ultimately used may vary from the initial angles suggested by the structure of the venue. For a rectangular seating area, the angle H may vary over the height of the horn, as it will be narrower at the top than at the bottom to cover the same width at the greater distance of the back row. For a seating area that widens with distance (with appropriate dimensions), the angle H may be constant over the height of the horn, the increased coverage with distance matching the increased width of the back of the seating area. Generally speaking, the angle H varies along the height of the horn according to a function based on the variation in coverage area with distance. With a sufficiently large number of drivers, extremely complicated seating areas may be covered quite efficiently.

The system predicts (116) the total radiated power that will be required to provide the specified sound level over the listening area. The power and the coverage angles may be determined independently, or they may be co-dependent. In cases where the diffraction slot source is driven by multiple acoustic transducers, which we refer to as drivers, the user optionally selects (118) a number N of drivers to be used. The number of drivers may be traded off against the wall length L of the horn (see FIG. 4A) to achieve the required radiated power. A horn with longer walls (for given coverage angles H and V) will have a wider mouth, providing control of directivity down to lower frequencies, thus requiring less power to cover a given area than would a shorter horn. A given driver has a fixed amount of power available, so the number of drivers needed is affected by the amount of control the horn provides over power distribution and the impedance matching of the driver to free air provided by the horn. The total length of the source, determined by the number of drivers and their dimensions, also affects the efficiency with which it delivers the power provided by the drivers. In many cases, the dimensions of the horn are constrained by the architecture and by visual considerations, and the number of drivers is dictated by the power required to provide the specified SPL over the listening area. Different models of driver may also be specified to deliver different power levels. Once H, V, N, and L have been determined or input, the system has the information needed to design a source and horn that will provide the specified coverage.

Geometrically, the transducing mechanism may be distant from the aperture or surface that radiates sound, as described below. We refer to the radiating apertures or surfaces that are arranged in a line to form the diffraction slot source as "sources" to differentiate them from the "drivers" that actually transduce electric signals into acoustic pressure. It is the arrangement of these "sources" that is discussed here in reference to FIGS. 1 through 3. Generic speaker symbols are used to represent the sources in FIG. 3 without implying any particular transducer technology or geometric relationship between the drivers and the sources. The precise positioning of the drivers may be independent of the positioning of the sources, and is described later with reference to FIGS. 8 through 10. For this discussion of the algorithmic design of the loudspeaker, the sources may be considered as drivers located directly at the diffraction slot, as illustrated.

For a circular arc-shaped diffraction slot, the N sources are simply positioned (120) in an arc, with the angular extent of the arc corresponding to the total vertical coverage angle V, and the radius dictated by the number of sources N that must be fit into the arc at that angle and their heights.

For a diffraction slot with a progressive curve shape, where the radius of curvature varies with position, there are several methods that may be used to determine the angles and positions of the constituent sources. In some examples, the angles are determined following an arithmetic or other mathematical progression, such as a geometric series, and their positions are set to form a continuous source along that curve.

Figure 3A:
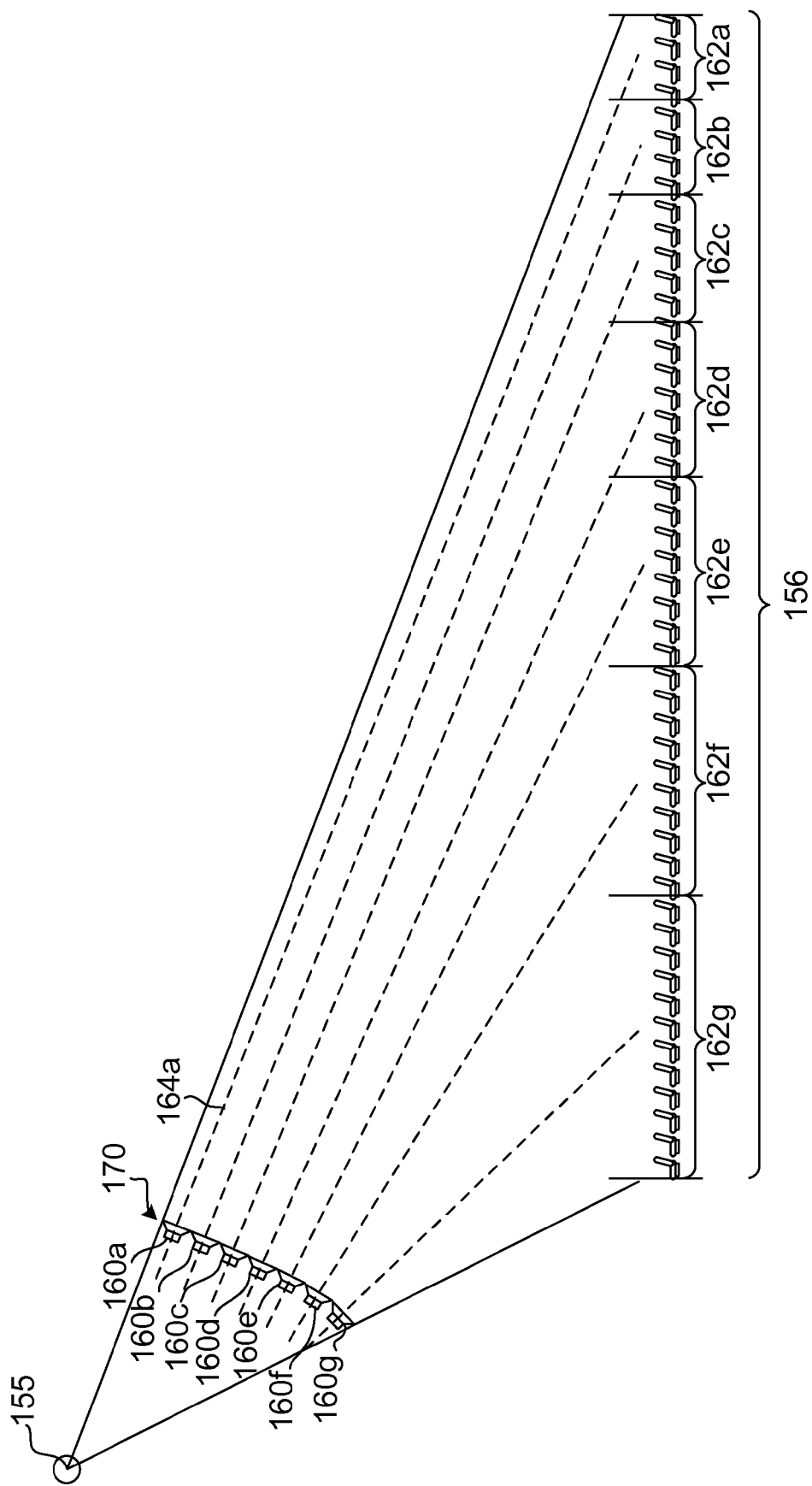
FIGS. 3A, 3B, and 7A show schematic side elevations of a model of a loudspeaker in a venue.

In another example, the system may use a model illustrated by FIG. 3A and described below to design the curved diffraction slot and position the sources. The illustration of horn positioning in FIGS. 7A and 7B may also be informative for this discussion. Given H, V, and the required power over the listening area, the system divides (120a) the listening area 156 into N equal-power strips 162i (in the case of FIG. 3A, N=7, so there are seven strips 162a-162g) along the length of the listening area, each spanning its full width, and lays out an array 170 of N sources (160a-160g in FIG. 3A) corresponding to the strips 162i. For a given power available from the drivers and a properly dimensioned horn, each source can illuminate an area, perpendicular to the source's axis, of a particular size (an equal-sized area at a greater distance calls for a narrower horn, constraining the power to a narrower solid angle). The strips 162i represent portions of the listening area that are provided the same sound levels from sources driven by drivers of uniform power. Whether the strips increase, decrease (as shown), or maintain constant depths with increasing distance from the loudspeaker depends on a number of factors, including whether the listening area increases or decreases in width, the angles between the loudspeaker and each strip, and how well the loudspeaker controls dispersion at increasing distances. The sources 160*i* are aimed (120*b*) to each cover their respective strip 162*i*, and arranged to form a continuous curve.

Figure 3B:
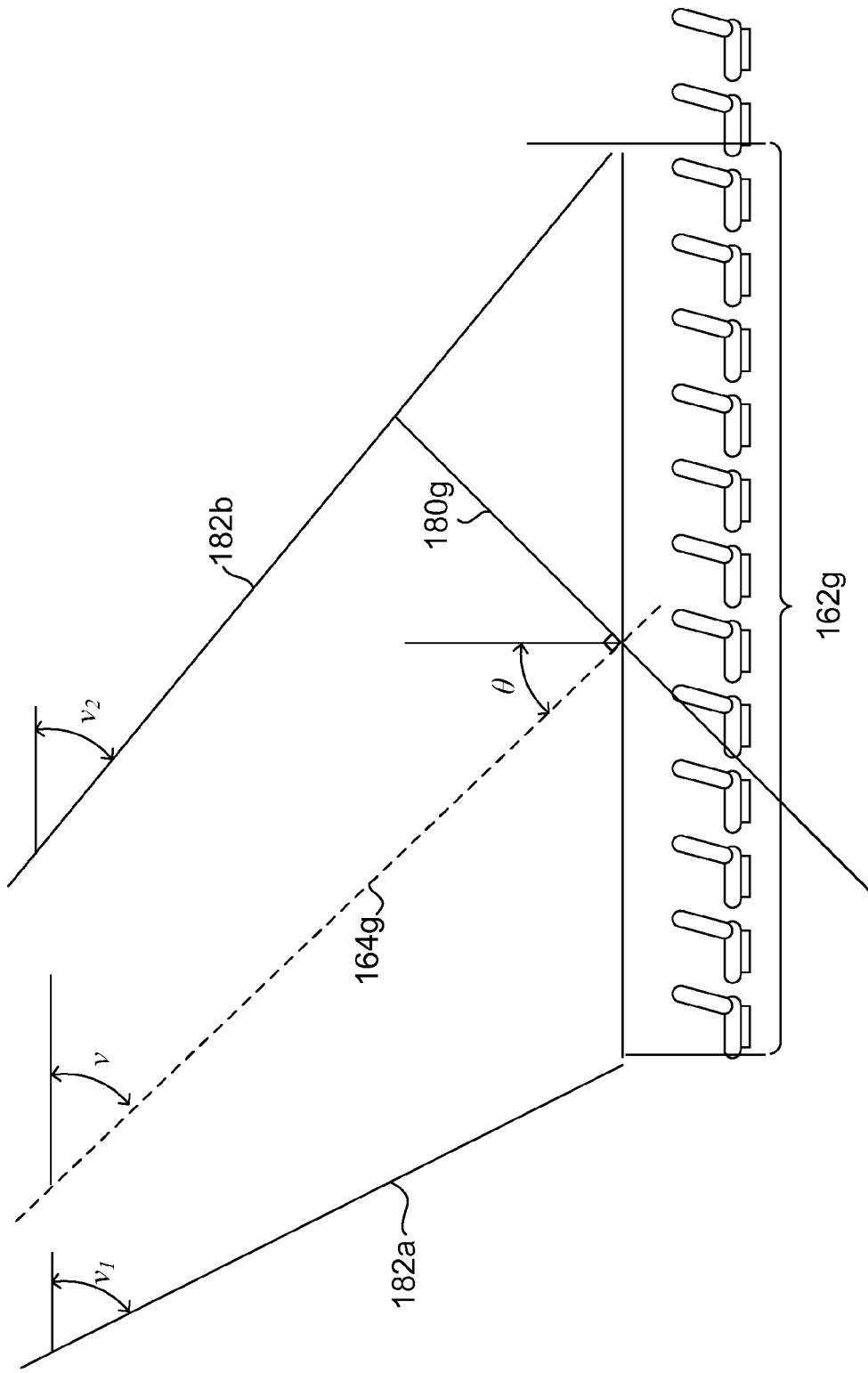

In some examples, the listening area is divided into the equal-power strips as follows. FIG. 3B shows a detail of one strip 162*g* from FIG. 3A, with additional measurements indicated. When the loudspeaker is projecting to the listening area strip 162*g* at an angle, the listening area is covered by a projected area 180*g* that is perpendicular to the direction of radiation, indicated by axis 164*g*. The projection to the listening area strip 162*g* is bounded by front and rear planes 182*a* and 182*b*. For a small section of the listening area at a downward angle v from the loudspeaker, which we call the coverage area Ac, the projected area Ap(v) is computed from the coverage area Ac(v) and the incident angle θ:

$$A_p(v) = A_c(v) \times \cos(\theta). \quad (1)$$

The power required to provide the specified direct-field intensity Id is equal to the intensity times the area covered. For a loudspeaker that is close enough to the listening area that the angle of incidence varies appreciably from the front of the listening area to the back, the actual coverage areas vary with angle (which in turn varies with position), even while projected areas remain constant with distance, so we compute an integral over the listening area (i.e., between vertical angles v0 at the front and vn at the rear) to find the total required power:

$$W_{req} = \int_{v_0}^{v_n} I_d(v) A_c(v) \cos(\theta) dv. \quad (2)$$

The function defining $A_c(v)$ in the integral (2) depends on the geometry of the venue and the loudspeaker location, as does θ. Direct-field intensity $I_d$ may also be a function of the position in the listening area, or it may be constant. The particular solution to the integral will therefore be based on the inputs to the process 100, and it may be solved numerically or algebraically, depending on the capabilities of the system carrying out the process 100.

The required power $W_{req}$ is divided by the nominal power $W_s$ provided by one driver to find a lower bound for N, that is:

$$N \geq \frac{W_{req}}{W_s}. \quad (3)$$

The user may specify a larger value of N, or may choose to at least start with the computed minimum value. The listening area is then divided up into the equal power strips 162*i* by solving the integral (2) for values of $v_1$ and $v_2$ that define an area covered by the power $W_s$ of one driver:

$$W_s = \int_{v_1}^{v_2} I_d(v) A_c(v) \cos(\theta) dv. \quad (4)$$

Starting at the rear of the listening area, where $v_2$ is known (i.e., for the first strip, $v_2 = v_n$), the integral (4) is solved iteratively for each strip 162*i*, with the previous slice's lower angle $v_1$ becoming the next slice's upper angle $v_2$. If the user has specified a larger for N than that required by (3), then $W_s$ in (4) can be replaced by $W_{req}/N_{user}$. As the angles vary, the areas of the actual coverage areas will vary, while the projected coverage area is the same for each actual coverage area. In some examples, such as where the loudspeaker is low to the ground and the angles of incidence quite severe, additional numeric calculations may be needed for each source and coverage area, rather than the simplifications just noted. In the case of a single horn, the actual coverage areas are rectangular (or nearly-rectangular) strips spanning the width of the listening area and having varying depths, as shown in FIG. 3. The dimensions used in FIG. 3 are arbitrary, and selected only to illustrate the process. If multiple loudspeakers are to be used, the strips may cover less than the full width of the listening area. Once the strips have been found, the sources are each aimed (120*b*) to cover their corresponding strip.

An iterative process may also be used to determine the positions of the sources and define the curve of the total diffraction slot source. A first source 160*a* is positioned with its top edge defining the top end of the curve. This source begins the curve just above the plane connecting the point source 155 to the back row, so that the drop off in energy (typically −6 dB) at the edge of the projected coverage area falls outside the listening area. The source 160*a* is tilted such that its axis 164*a* passes through the center of the rear-most strip 162*a* defined in (4), thus defining the source's pitch angle. The pitch angle for each source will correspond to the angle v at the center of the corresponding strip, used in the calculations above. From the top edge position, pitch angle, and the dimensions of the source, the location of the first source's lower edge is known. The next source is positioned with its top edge at the lower edge of the previous source, and the above steps are repeated. This continues until all sources are positioned, producing the progressive curve seen in FIG. 3. The final source will be located with its bottom edge extending just beyond the plane connecting the point source 155 to the front row. The drop-off in power at the edges of the coverage areas is compensated for between sources by the overlap that results in the coverage of adjacent sources. The areas computed above will result in angles between sources that properly overlap the projected areas of each source, using the overlapping coverage of the sources to provide even coverage in the transition regions. The same process could be applied starting with the lowest source 160*g* and the front-most strip 162*g*, and the process may be varied to meet other goals, if, for example, uniform intensity over the listening area is not desired.

Figure 4A:
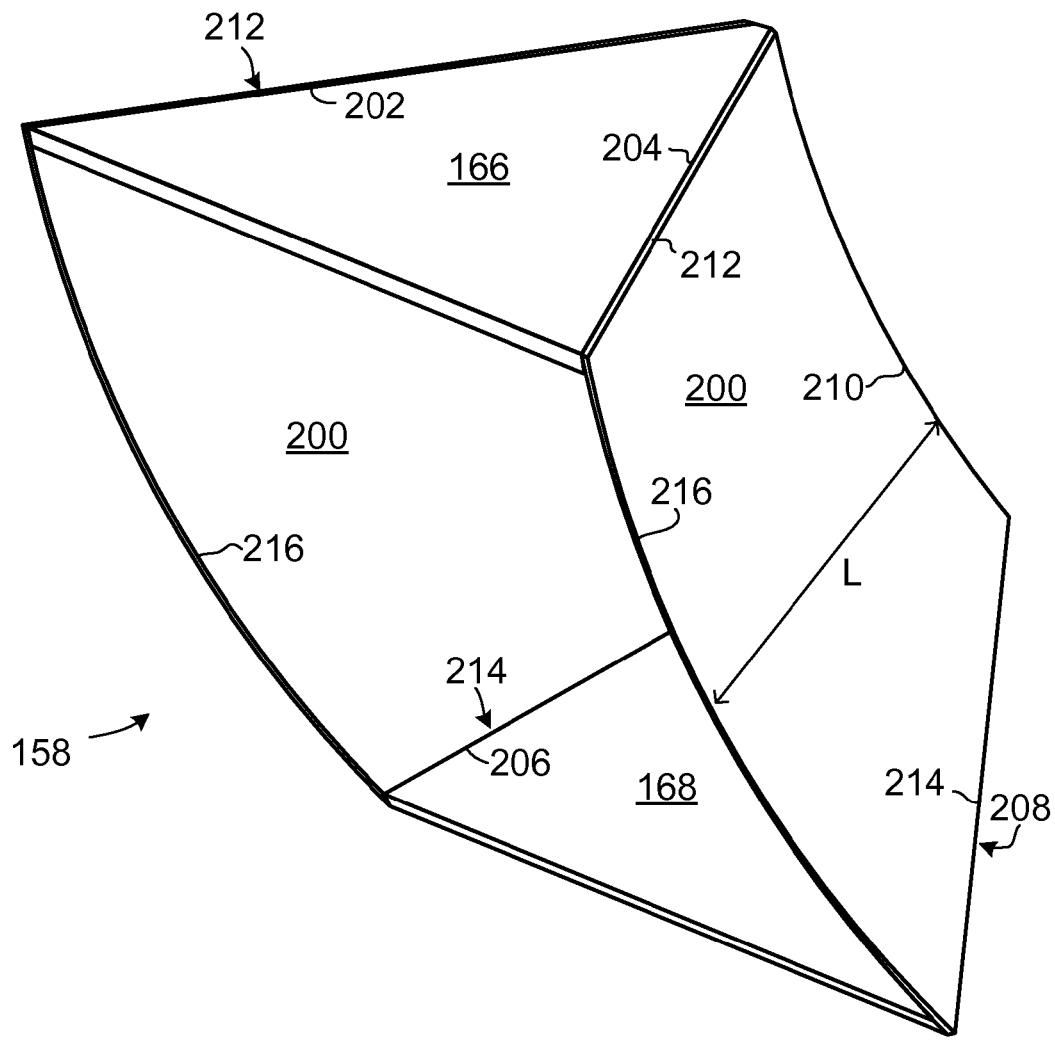
FIG. 4A shows a perspective view of a loudspeaker horn constructed from flat panels.
Figure 4B:
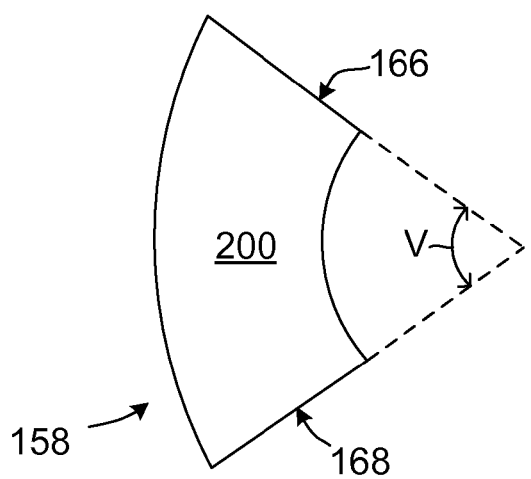
FIG. 4B shows a side elevation view of the loudspeaker horn of FIG. 4A.
Figure 4C:
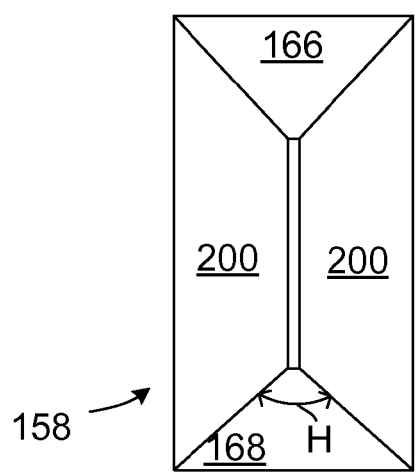
FIG. 4C shows a front elevation view of the loudspeaker horn of FIG. 4A.

Once the diffraction slot source provided by the arc of sources is defined, the horn walls are designed to confine the sound radiated by the sources to the listening area. A generalized horn 158 is shown in FIGS. 4A-4C. Independently of the source curvature, the horn 158 may have a complex shape that is narrower and deeper at the top, for projecting sound to the back of a venue, and wider and shallower at the bottom, for spreading sound over the front of the venue. This allows a single loudspeaker to cover a significant portion of the listening area. In other examples, the horn maintains the same shape from top to bottom. To define the walls of the horn 158, flat top and bottom panels 166, 168 are positioned (122) in planes separated by the vertical coverage angle V to align with the top and bottom of the listening area 156 (FIG. 2) (more generally, the panels 166 and 168 may be referred to as end panels, as the loudspeakers may be installed in various orientations). Side walls 200 of the horn 158 are next defined (124) to align with the sides of the listening area 156. The side walls 200 are separated by the horizontal coverage angle H, which as noted above, may vary with height. To accommodate the curved source defined in the previous steps, the side walls 200 are also curved. In the horn fabrication process described below, the side walls are formed from flat panels and bent to the needed curved shape. In some examples, the ideal curve of the side walls puts too much stress in the material, so the curve of the side walls is softened (124*a*) from the ideal shape as needed. If additional loudspeakers are called for, they are designed (113) following the same process, iteratively or in parallel with the first loudspeaker.

Once the horn geometry has been determined, it may be refined. Sound system simulation software may be used (126) to determine equalization parameters and predict the radiation pattern of the loudspeaker. The predicted radiation pattern is then offered (128) to the user, either graphically, as described, for example, in U.S. patent application Ser. No. 10/964,421 or through an audio simulation, as described, for example, in U.S. Pat. No. 5,812,676, both incorporated here by reference. The user chooses (130) to accept the design to or make changes to one or more of the parameters (H, V, N, or L, or one or more of the original input parameters). For example, changing the number of drivers, the wall length, or the coverage angles may result in a smoother radiation pattern. If too many drivers are specified for the budget, the user might decrease the specified sound level; alternatively, if there is room in the budget, the user might directly specify more drivers or might raise the specified sound level. If changes are made, the process iterates the source and horn design steps to produce and simulate a new design. In some examples, the iteration is also automated. If the predicted radiation pattern does not match the input parameters within some threshold, the process uses the difference to refine the values of H, V, N, or L, and then repeats the appropriate steps to alter the shape of the source and horn according to the refined values. This may repeat until the values converge, that is, the deviation from the target, improvement per iteration, or the changes called for to further refine the design are less than some threshold. Once the horn shape is accepted (130), the side walls are mathematically (analytically or numerically) transformed (132) into flat shapes. Plans for the top, bottom, and side walls are output (134) for fabrication (136), described below.

In some examples, the loudspeaker design process 100 is paired with a system configuration process 138 that uses the same or similar inputs and outputs configuration parameters such as equalization settings, time delays, limiter levels, bills of material, schematics, and the like. An automated process for system configuration is described in U.S. Pat. No. 7,206,415, incorporated here by reference. Configuration 138 may also be performed manually. Finally, the system is installed (140) and put to use.

Figure 5B:
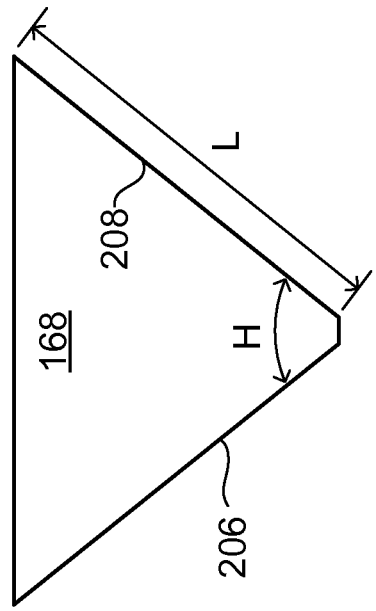
Figure 5A:
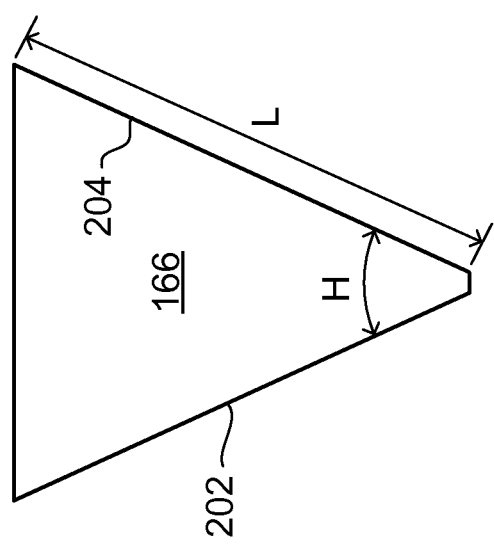

A particular loudspeaker well-suited for customization and, in particular, the automated design process described above, is shown in FIGS. 5 through 10. FIGS. 5A, 5B, and 6A show flat panels that might be designed according to the process described above and assembled to form the horn shown in FIGS. 4A-4C. In particular, the side panel 200 in FIG. 6A is joined to top and bottom panels 166 and 168 like those in FIGS. 5A and 5B to form a horn for use with a circular arc source. The process of determining the shape of these panels is described below. Creation of a horn for a progressive curve from similar materials is described farther below with reference to FIGS. 7A through 7I. A set of modular manifold sections, such as those shown in FIG. 8, couple to the transducers' respective radiating apertures or surfaces and are assembled on a rigid, curved keel shown in FIG. 9 to form the curved diffraction slot source that is joined to the horn 158 to form the complete loudspeaker 154, shown in FIG. 10. While loudspeakers of this type may be designed and built manually, they are well-suited to the automated process described herein, which deterministically designs the speakers based on the input performance and venue parameters.

The horn 158 is formed from four surfaces that begin as flat panels and are joined to form the complex curvature needed. As shown in FIGS. 5A and 5B, the top and bottom panels 166 and 168 are triangles (with their tips truncated) with side edges 202, 204, 206, and 208. The central angles of the triangles determine the horizontal coverage angle H of the horn. If the triangular end panels 166 and 168 are identical (not as shown), then the horizontal angle will be constant along the height of the horn. If the end panels are not identical, the curvature of the side walls will be more complex and H will vary along the height of the horn. One end may be narrower and deeper, while the other end is wider and shallower, though width and depth may be independent. Such a complex curvature provides the long and narrow top and short and wide bottom described above. In an even more complex curvature, the paired edges 202 and 204 of the top panel 166 may be different lengths from the edges 206 and 208 of the bottom panel 168, causing the wall length L to vary along the height of the horn. This may provide, for example, a horn with a narrow end and a wide end, but with the same depth at both ends. In the example shown, the triangles and therefore the horn are symmetric about one axis, but this is also not a requirement. The horn may be asymmetric in the horizontal plan, in which case the opposite edges 202/204 and 206/208 of each triangle will be different.

Figure 6C:
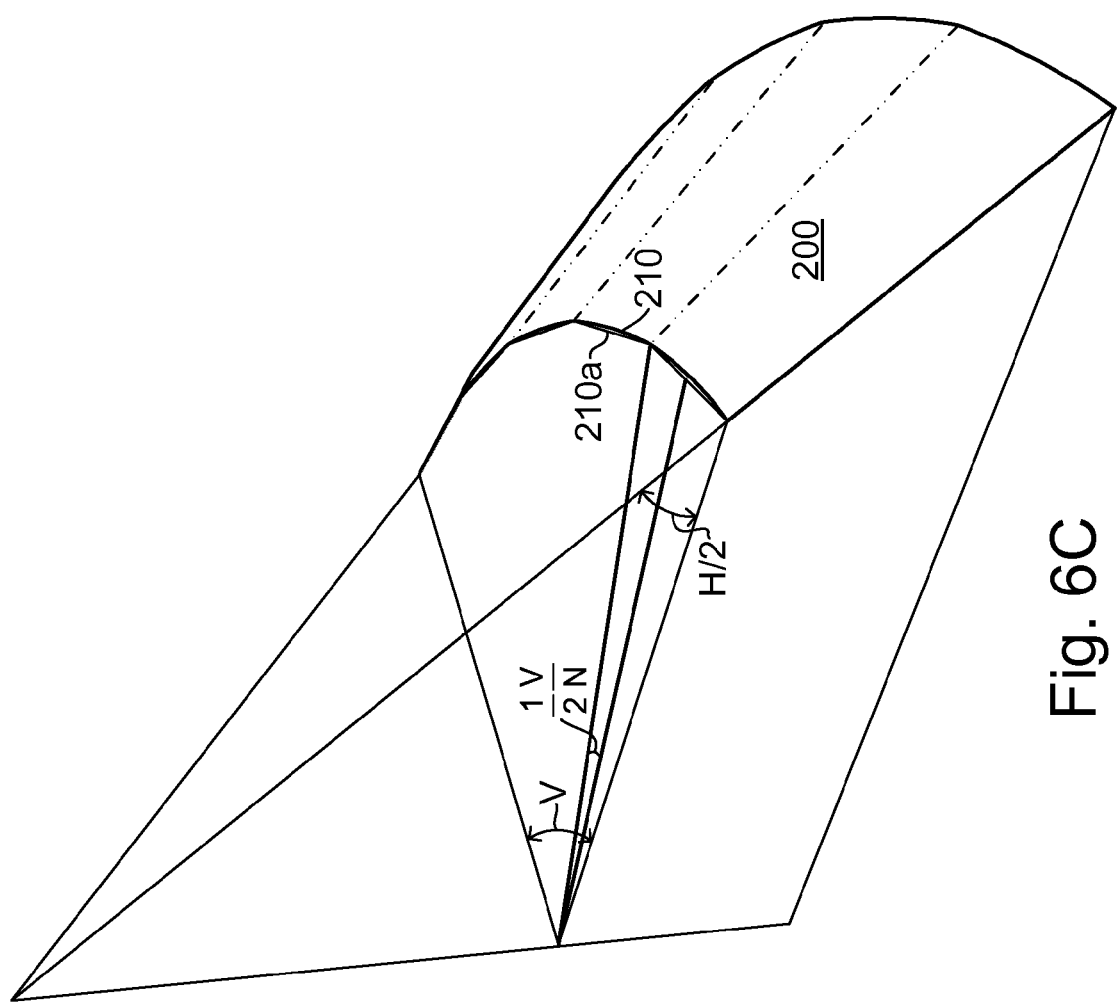

FIG. 6A shows the flat side panel 200 that will be joined to the triangular end panels 166 and 168 to form a horn fitting a source with a circular curvature. The panel 200 is a section of an annulus, defined by an inner circumferential section 210 with a radius $R_1$ from a center point 211, an angle $V_f$ between two edges 212 and 214, each of length L (the depth of the horn), and an outer circumference 216 at a radius $R_2$. Joining two panels 200 such that the inner edges 210 of the two panels remain parallel while the panels diverge at the horizontal coverage angle H imposes a curvature on the panels along their vertical extent. As shown in FIG. 6B, the side panels 200 for such a horn each correspond to a section of the surface of a section of a cone 220 (only part of the cone is shown). FIG. 6C is the same as FIG. 6B with only one panel 200 shown for clarity. The cone has an apex 221, and the surface defining side wall panel 200 is a band with its edges 212 and 214 lying on lines 222 and 224, and with the inner circumferential edge 210 and outer circumferential edge 216 forming parallel circular arcs on the surface of the cone 220.

The dimensions of the side panel 200 are determined by certain aspects of the cone 220, which are in turn determined by the starting values H, V, N, and L, defined earlier. In FIG. 6B, a horizontal plane 228 defines the inner edge 210 by its intersection with the cone. The plane 228 contains the arc of the curved diffraction slot source (not shown), which will normally be vertical when installed. The side panel 200 extends away from the plane 228 towards the base of the cone. In FIG. 6B, the second side panel is offset a small amount from the cone, representing the width of the diffraction slot source—a second cone corresponding to the second panel is not shown.

The angle between the side panel 200 and the plane 228 is H/2, as each side panel 200 is one-half the horizontal coverage angle H from the center plane 228. Because plane 228 is perpendicular to the axis 230 of the cone, H/2 is also the base angle of the cone. The vertical coverage angle V of the horn matches the angle in the plane 228 between planes defining the end panels 166 and 168, which intersect at the axis 230 (while the planes aren't shown, they correspond to the near and far faces of the illustrated section of the cone 220). As noted, the length of the edges 212 and 214 is L, directly defining the length of the horn walls. (The far edge 214 of the lower panel 200 is obscured, but both edges 212 and 214 are visible and labeled on the upper panel and in FIG. 6A.)

The inner circumferential edge 210 connects a number of line segments 210a matching the number of drivers N, each of which has a length B. Projecting a perpendicular segment 234 from the center of one segment 210a back to the axis 230 of the cone forms a right triangle having a base of length B/2 and a hypotenuse 238. The length $R_s$ of the hypotenuse 238 is the radius in the plane 228 of the inner circumferential edge 210 when the panel 200 is bent to conform to the cone. The angle of this triangle, at the axis 230, is $$\frac{1}{2}\frac{V}{N}$$

(as the angle V is divided into N segments, and this triangle further divides one of those in half), and the base length is B/2, so the length of hypotenuse 238 is found as:

$$R_s = \frac{B}{2\sin\left(\frac{1}{2}\frac{V}{N}\right)}. \quad (5)$$

The value of the inner radius $R_1$ and of the angle $V_f$ between the edges 212 and 214 of the flat panel 200 in FIG. 6A are found from the fact that when the conic surface is laid flat, the edge 210 is remains circular, but with a different radius $R_1$ than that it had in the cone, $R_s$. As a result, the arc length of edge 210 is the same in both figures, thus:

$$R_1 V_f = R_s V. \quad (6)$$

The segment of the line 222 from the corner of the panel 200 to the apex 221 also has length $R_1$. This segment can be seen to form a right triangle with the radius 238b and the axis 230 of the cone. Knowing the angle H/2 between the plane 228 and the surface of the cone, the length from the apex 221 to the edge 210 is found as:

$$R_1 = R_s \frac{1}{\cos(H/2)}. \quad (7)$$

Solving (4) and (5) for $V_f$, $$V_f = V \cos(H/2). \quad (8)$$

Combining (5) and (7), $R_1$ is also found in terms of the inputs:

$$R_1 = \frac{B}{2\sin\left(\frac{1}{2}\frac{V}{N}\right)\cos(H/2)}. \quad (9)$$

Given $V_f$, $R_1$, and L, the panel 200 can be cut from a flat sheet, as it is simply a section of an annulus having inner radius $R_1$, outer radius $R_2 = R_1 + L$, and included angle $V_f$.

The horn shown in FIG. 6B maintains a constant angle H, such that the top and bottom panels 166 and 168 are identical. Once a panel is designed according to the cone's geometry, however, it may be used in a horn having a varying horizontal angle by using top and bottom panels with differing angles. To design a horn that varies in length L along its height, the outer radius $R_2$ may be varied with position, independently of whether H will be varied as well. In such a case, the outer radius R2 may vary monotonically from one end to the other, that is, it will increase or decrease, depending on point of view. If L and H are varied together, such that the walls lengthen as the horizontal angle decreases, a horn may be formed with a varying angle but still having a rectangular mouth, or even having a mouth that gets wider as the angle gets narrower.

Figure 7A:
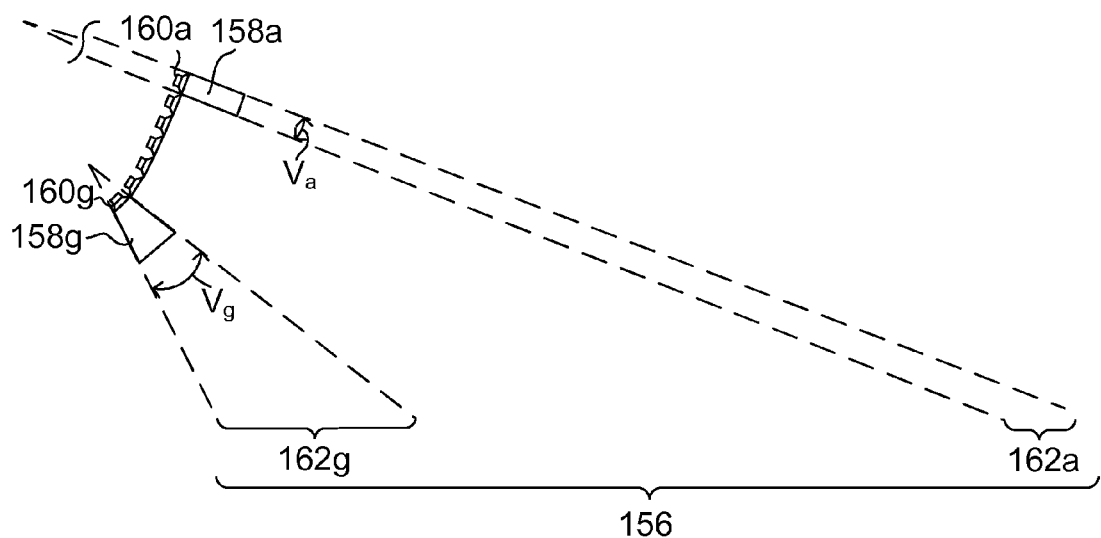
Figure 7B:
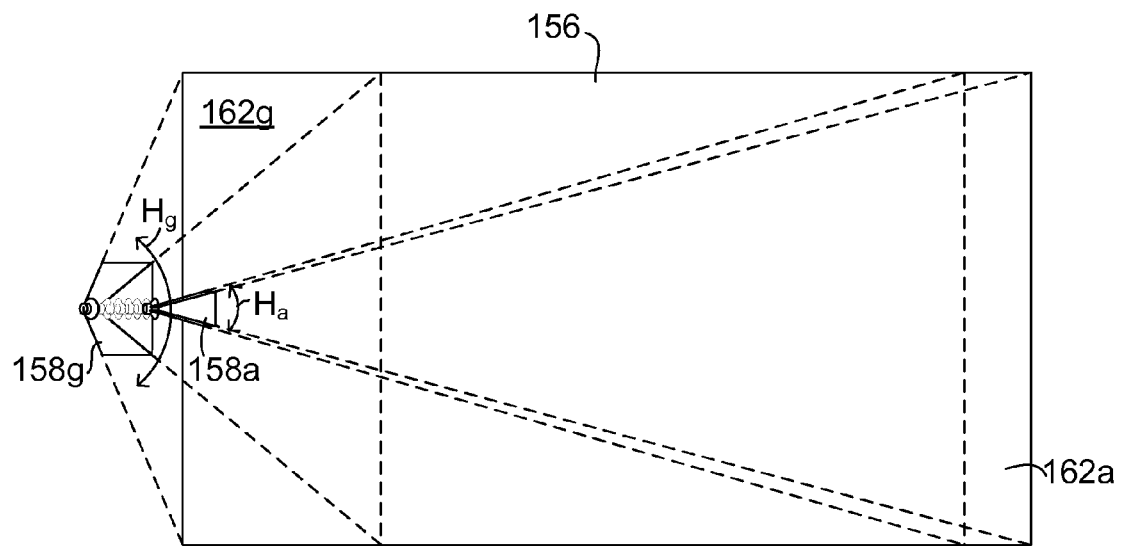
FIG. 7B shows a schematic plan view of a model of a loudspeaker in a venue.
Figure 7I:
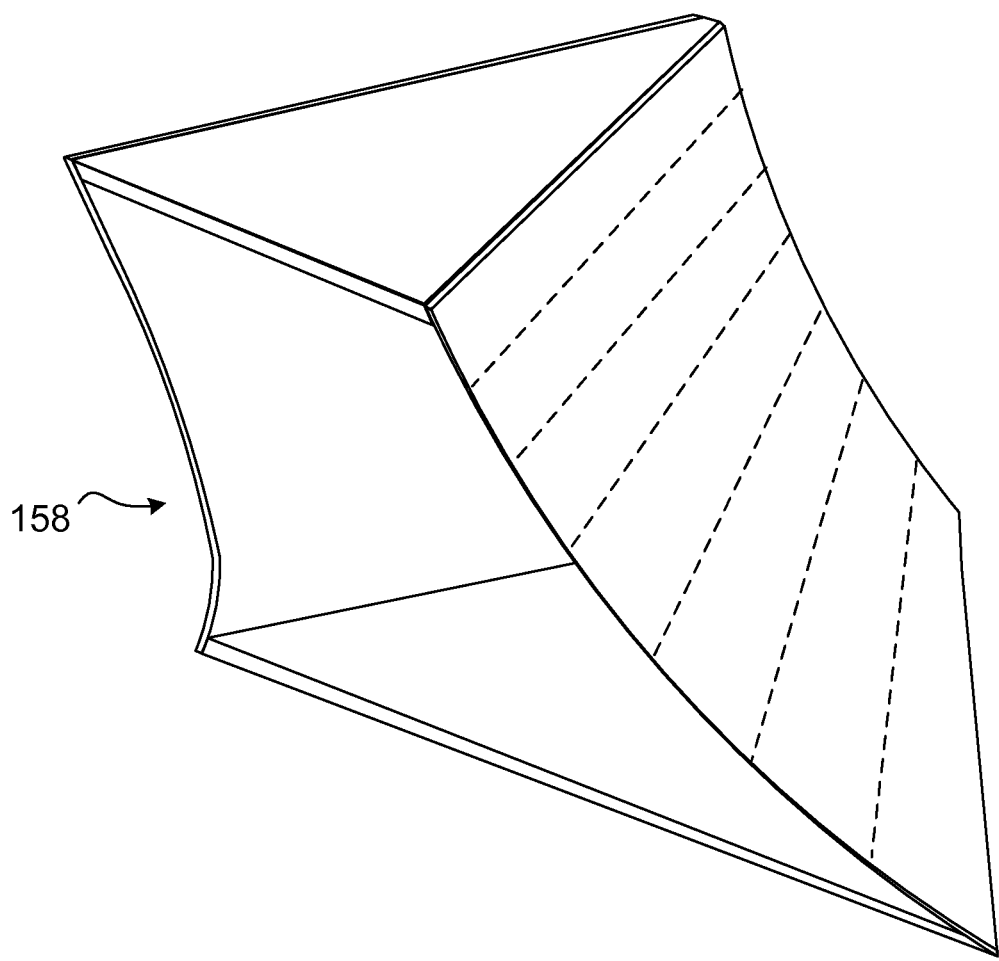
FIG. 7I shows a perspective view of the model of FIG. 7F.

A second method of forming the horn sides begins with a series of flat shapes. This method is useful, for example, with a J-curve, progressive curve, or other complex source. As shown in FIGS. 7A through 7E, the horn 158 can be conceptually divided into a series of stacked sub-horns 158i, one for each driver. FIGS. 7A and 7B show only the top and bottom sub-horns 158a and 158g (for a seven driver horn), for clarity. It should be noted that these figures are not to scale within or between figures. Each sub-horn has its own horizontal and vertical coverage angles, Hi and Vi, based on the relationship between its location and the corresponding strip 162i of the listening area, explained above with regard to FIG. 3. A stack of such sub-horns 158i is modeled as shown in FIGS. 7C through 7E. Initially, each sub-horn is modeled has having a rectangular mouth, formed by smaller, flat versions of the side walls and its own triangular top and bottom panels. In a simplified case, the side walls may be initially modeled as trapezoidal or as sections of annuli found as described for a circular arc source, above, each with an N of 1 and H, V, and L set according to the coverage area of strip 162i. As seen in FIGS. 7A and 7B, the top and bottom panels are positioned to begin at the upper and lower edges of their respective sources 160a, 160g (determined at steps 120a and 120b of process 100, above) and align with the top and bottom ends of the corresponding slices of the listening area (as noted with regard to the source locating process, the actual coverage areas are typically extended just beyond the limits of the listening area, to account for the drop-off in power at the edges of the coverage areas). Dashed lines corresponding to these coverage areas are shown for sources 160a and 160g in FIG. 7A. The angle between these lines, projected back to their intersection, will be the Vi for that sub-horn (the intersection of the nearly-parallel top and bottom lines for strip 162a would be far off the page, so those lines are shown truncated). It should be noted that because all three axes in the figures are drawn to different scales, as are the different components, the geometrical relationships in the figures may not match a real-world implementation. Joining together such a stack of sub-horns with different vertical coverage angles allows a more uniform frequency response over the entire listening area.

Once the stack of sub-horns is modeled, their trapezoidal side-walls are deformed to meet at their edges and corners to form a sheet, and curved to provide the sheet with a continuous curvature, as shown in FIGS. 7F through 7I. Dashed lines show the edges of the deformed and merged segments. Various techniques may be used to join the panels, such as averaging lengths, matching mid-points, or moving each bottom corner out to the adjacent top corner, to name some examples. The top and bottom panels of each modeled sub-horn (except the outermost top and bottom panels) are removed, leaving a single open mouth. In some examples, one or more of the intermediate top and bottom panels or smaller bracing members may be retained to lend structural stability to the horn and maintain the designed horizontal angle H. If the curvature of the side panel generated by this process exceeds what is possible or structurally sound for the material to be used, then the curvature may be modified, such as by widening or narrowing the horn to remove inflection points (where curvature changes from convex to concave) or decreasing radiuses. In some examples, it has been found that extremely complex curvatures are possible, as long as there remains at least one direction at any given point where the local relative curvature is zero.

To form a complex curvature from flat panels, the side panels 200 are fabricated from a thin, flexible material having enough stiffness to maintain a relatively rigid finished assembly, once the ends are fixed to the less-flexible top and bottom panels, which are in turn fixed to the keel. In some examples, PVC sheets having a thickness of 3.18 mm (0.125 in) have been found to have a suitable stiffness. Aluminum sheets having a thickness of 1.27 mm (0.050 in) have also been found to have a suitable stiffness, though metals may not have enough internal loss to prevent sound from escaping through the walls. The triangular end panels 166 and 168 are not curved in this example, and can therefore be made from stiffer or thicker flat material. We have found that plastic side walls prevent even very high pressure sound from escaping through the walls, despite the thin material. We believe this may be due to the stressed curvature of the side walls increasing their rigidity once assembled, together with a high internal loss in the material. By "flexible," we refer to material that can be bent to the desired shape while remaining within the elastic limits of the material, that is, there is no plastic deformation or cracking when bending the sheets to shape. In contrast, by "rigid" we refer to material having sufficient stiffness that it will impart the stress needed to maintain the bent shape of the parts it supports without being bent or otherwise deformed itself. It is preferred that all the materials used in the horn be environmentally stable. In some examples, a horn may need a small vertical angle and flat top and bottom ends, resulting in side walls with minimal curvature in the vertical direction. In order to add the stress needed for stiffness in this case, the side panels may be given a curvature in the horizontal direction, i.e., the horn width flares outward along a curve.

In some examples, the top and bottom panels may be curved. In such a case, the side panels may also be curved or may remain flat, depending on the particulars of the horn. For example, for very small vertical angles, the diffraction slot may have little curvature, resulting in generally flat side panels, while the top and bottom panels may be curved to flare away from the diffraction slot. In such a shape, the ends of the side panels would be curved, rather than straight, to conform to the curved end panels. If the curved end panels are formed from a rigid material, then the structure may remain as described above. On the other hand, if the end panels are formed from a flexible material, then the side panels may need to be rigid in order to support the curvature of the end panels. Alternatively, the joint between the keel and the curved edges of the side panels may impart sufficient rigidity that all four panels may be flexible and hold each other to shape, in tension.

Figure 8:
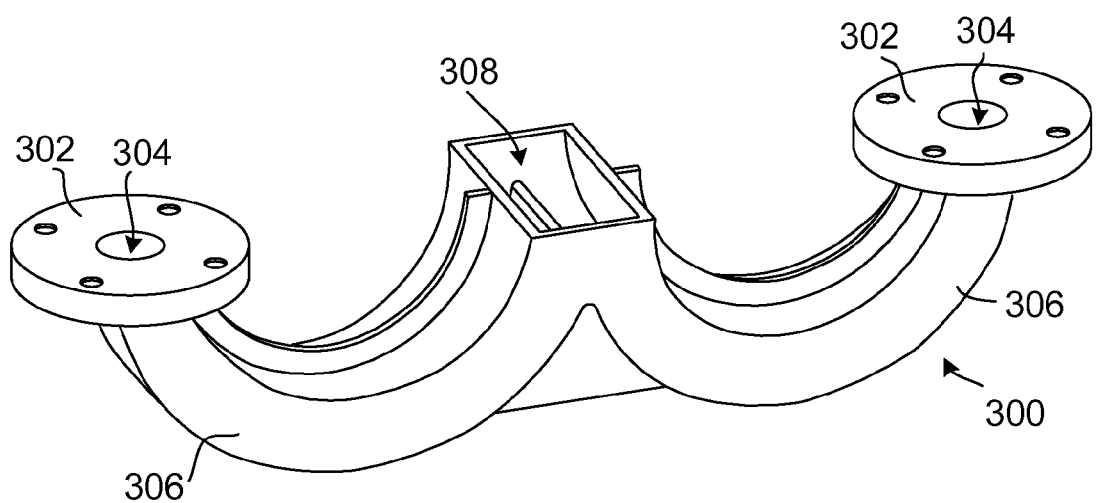
FIG. 8 shows an example transducer manifold element.
Figure 9:
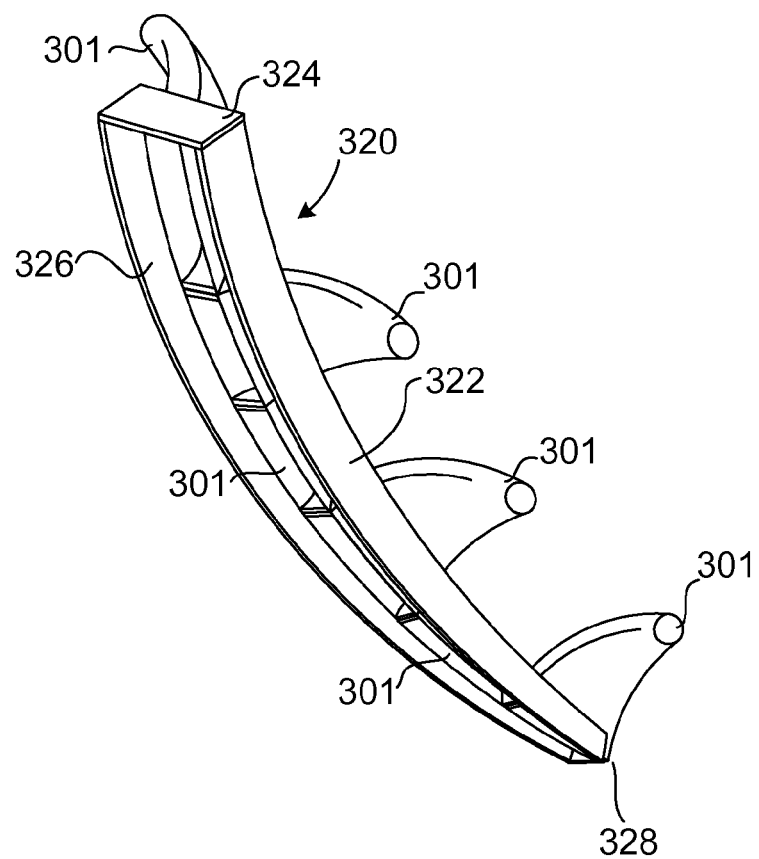
FIG. 9 shows a support assembly for components of a loudspeaker with example transducer manifold elements.

The audio source for use with the horn 158 in the complete loudspeaker is a curved diffraction slot driven by a set of electro-acoustic transducers. The transducers may be, for example, compression drivers, cone-type transducers, electro-static transducers, or other types of electro-acoustic transducers. The diffraction slot source is formed by stacking a number of modular manifold components that each couple mated transducers to a slot-shaped outlet. An example manifold component 300 is shown in FIG. 8. In this example, each manifold component 300 has two mounting plates 302 where compression drivers (not shown) are attached. The compression drivers direct sound energy into openings 304 into ducts 306. The ducts 306 end at a rectangular aperture 308. When a number of manifold components 300 are stacked, as shown in FIGS. 9 (with a different example manifold component 301) and 10, the apertures 308 together form the diffraction slot source. By moving the transducers away from the diffraction slot, and to the space behind the side walls of the horn, where there is more room, the manifold components 300 allow larger transducers to be used than if the transducers were directly located at the diffraction slot. While the example of FIG. 8 shows a two-sided manifold, single-sided manifold components may also be used, alternating sides as shown in FIGS. 9 and 12, to accommodate even larger diameter transducers.

In some examples, a rigid keel 320, shown in FIG. 9, is used to provide structure for aligning the manifold components in the desired curvature and joining them to the horn 158. In the example of FIG. 9, single sided manifold components 301 are shown, as opposed to the two-sided components 300 of FIG. 8. Each manifold component 301 couples a single driver (not shown) to the diffraction slot, with alternating manifold sections bending to opposite sides of the loudspeaker, accommodating drivers with a larger diameter. The keel 320 may also provide a structural "back bone" for the horn. In some examples, the keel is assembled from steel panels 322, 324, 326, 328 which provide a rigid support for anchoring the other components and hanging the assembled loudspeaker. In some examples, the keel is formed from two curved parts that simply sandwich the manifold components. In the example of FIG. 9, the manifold components are not anchored to the sides of the keel—the sides of the keel project forward of the manifold openings and will be positioned to either side of the rear of the horn, while the manifold components will meet the edges 210 of the side walls.

Figure 10:
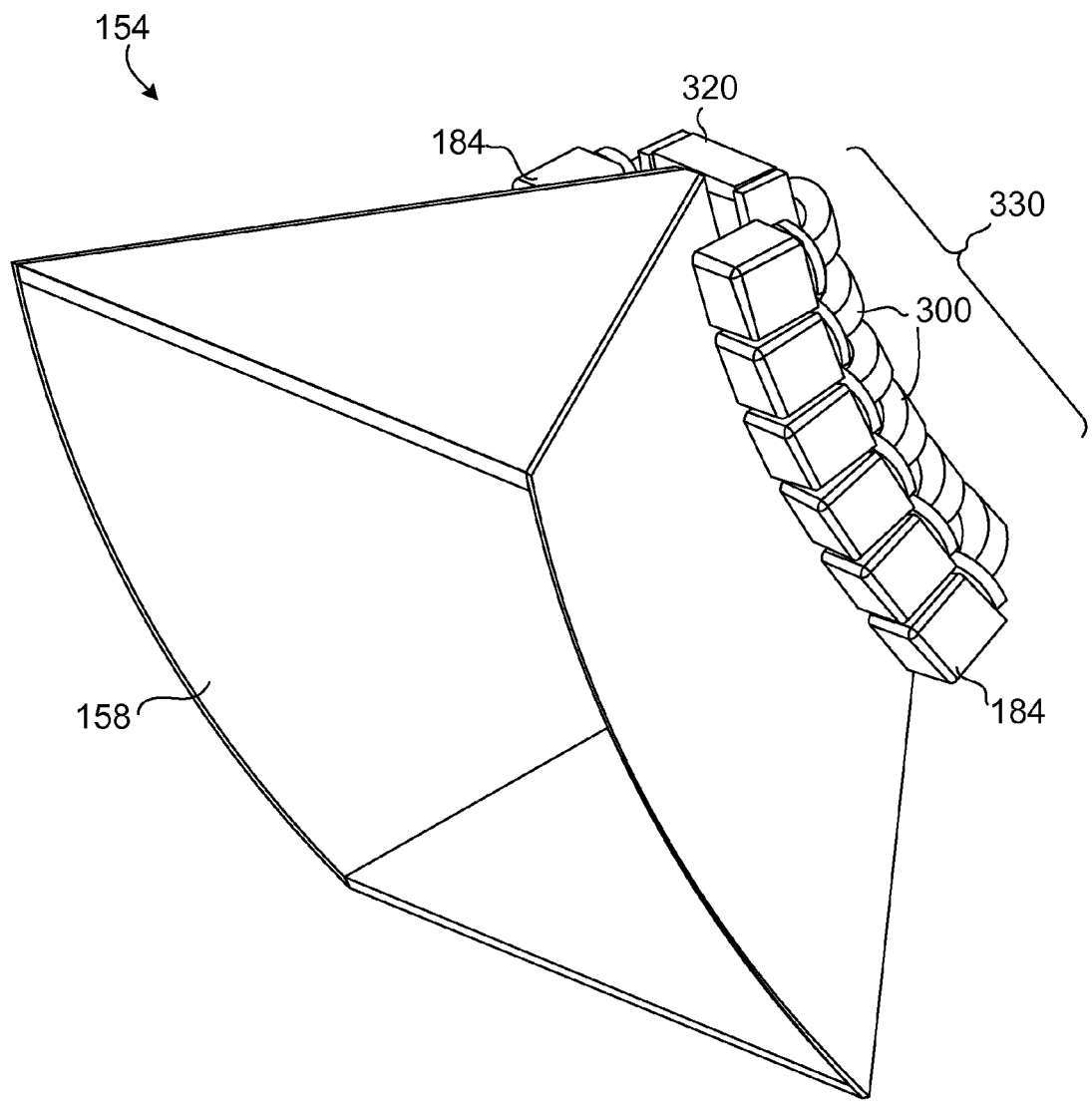
FIGS. 10 and 11 show assembled loudspeakers.

The components described above are assembled to form a complete loudspeaker 154, as shown in FIG. 10. The keel 320 is attached to the base of the horn 158. A stack 330 of manifold components 300 is attached to the keel 320 with their apertures 308 mating to the opening in the horn to form the diffraction slot source. Each manifold component is mated to at least one driver 184. In the example of FIG. 10, the two-sided manifold components of FIG. 8 are used, so two drivers are used with each manifold component, though only the top one on the far side is visible in the figure.

Figure 11:
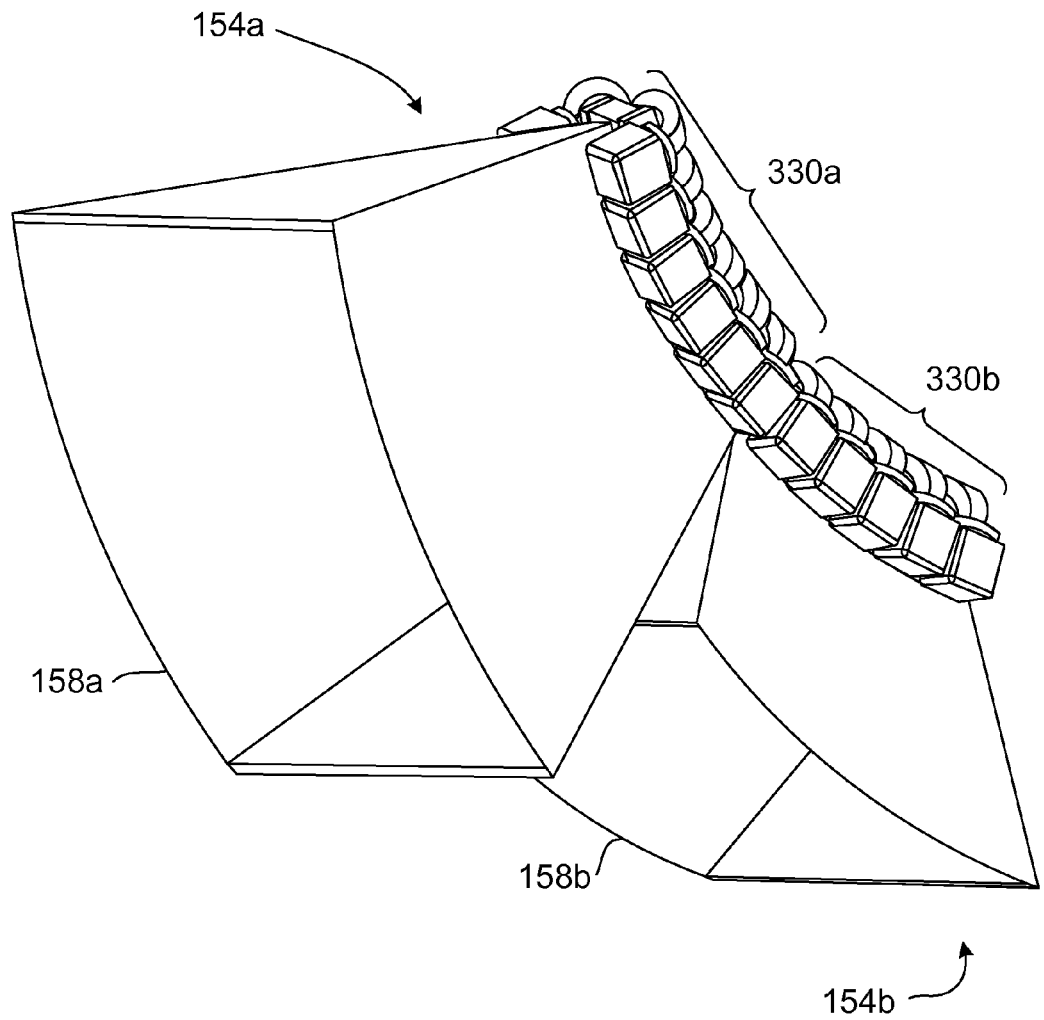

The area covered by the loudspeaker 154 is determined by the dimensions of the horn 158. Given a required coverage pattern, the necessary dimensions of the horn 158 can be determined as described above. In some examples, as shown in FIG. 11, multiple loudspeakers 154a, 154b having horns 158a, 158b with different horizontal and vertical angles and lengths, and manifold stacks 330a, 330b with the same or different numbers of drivers, may be stacked. This allows smaller individual components to be used, simplifying fabrication, shipping, and storage of components. In some examples, the progressive-curve process described above would result in too great a curvature in the side panels, so two or more stacked loudspeakers are used, each providing the coverage of the corresponding portion of the modeled single horn. When loudspeakers are stacked in this way, the top and bottom panels of adjacent horns are sufficiently thin that the adjacent diffraction slots are close enough together that they combine to act as a single continuously-curved diffraction slot.

As noted above, once the dimensions of the horn panels 166, 168, and 200 are determined, the system outputs (134) plans, i.e., instructions for fabricating (136) the panels and, in some examples, the keel, from flat stock. In some examples, the system directly outputs machine-readable instructions for use by an automated fabricator, such as a 2-dimensional CNC milling machine. The panels and keel may be cut on-demand, decreasing the amount of unique inventory that must be maintained for an installer to offer a large, and even unlimited, variety of custom horns. Whether custom-cut or pre-manufactured, the panels may be shipped flat and assembled at the point of installation, decreasing the volume of space required for storage and shipping. Various standard construction methods may be used to join the panels and other components, depending on the materials used, such as screws, adhesives, or press fittings.

In one example, the ends of the side panels are fixed to the top and bottom panels with screws, and additional plates are used to fix the top and bottom panels to the keel. Prior to fixing the top and bottom panels to the keel, the side panels are under decreased stress and may relax to a different shape, such that the edges forming the diffraction slot opening do not remain parallel. To assemble the horn, one end panel, i.e., the top or bottom panel, is fixed to the keel, and the other panel is then drawn toward the other end of the keel. As the free end panel is pulled into position, it forces the side panels to deform to the desired shape. In some examples, the side panel edges come into the desired curvature at the keel and fit into prepared grooves in the keel structure. Once the free end panel is secured to the keel, the bent edges of the side panels remain pressed into the groove in the keel, forming a tight fitting without the use of additional fasteners, though a sealant may be needed to fully seal the joint. In other examples, such as where the keel support structure is wider than the slot opening, the bent edges of the side panels to not meet the keel structure, but couple only to the manifold openings.

Figure 12B:
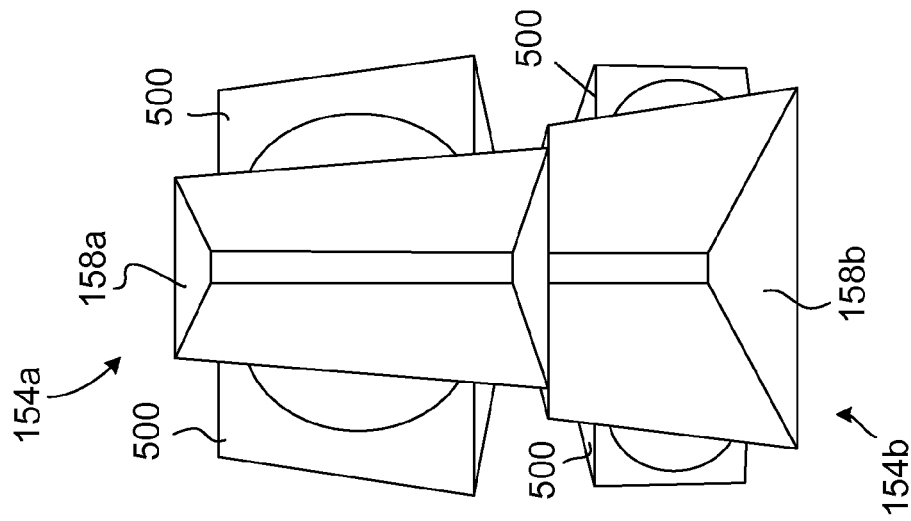
FIG. 12B shows a front perspective view of the loudspeaker assembly of FIG. 12A.
Figure 12A:
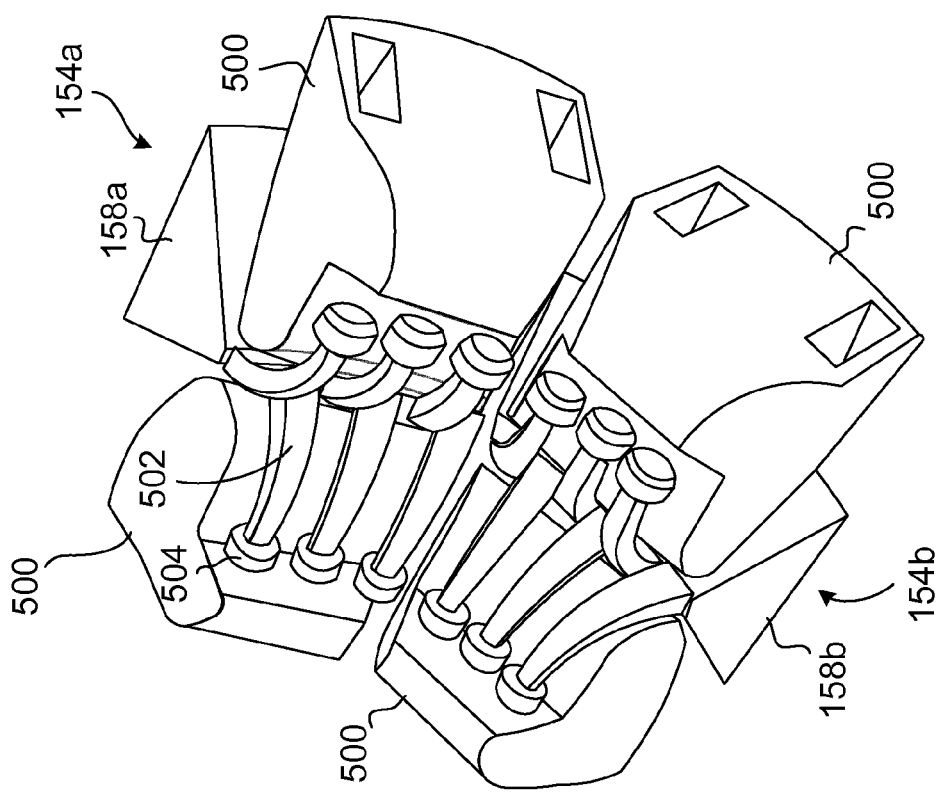
FIG. 12A shows a rear perspective view of a loudspeaker assembly.

The large horns described herein, in combination with arrayed transducers, achieve good directivity control over a wide frequency range, in some examples going as high as 20 kHz and as low as 400 Hz, 300 Hz, or even 250 Hz. For a complete sound reproduction system, modular bass loudspeakers may be added, as shown in FIGS. 12A and 12B. In the example of FIGS. 12A and 12B, modular bass loudspeakers 500 are shaped to fit partially behind the flare of the horns 158 of the loudspeakers 154. The bass loudspeakers 500 are shaped to fit behind horns having any flare angle or curvature within the range of possible horns, so the same bass loudspeakers 500 are used with any horn made using the above process. For example, in FIGS. 12A and 12B, the same bass loudspeakers 500 are used with a relatively narrow upper horn 158a and a relatively wider lower horn 158b. In the example of FIG. 12A, each manifold section 502 couples a single driver 504 to the diffraction slot, alternating sides, as in FIG. 9.

By providing good reproduction with controlled directivity down to 400 Hz or less from a single type of loudspeaker, and using the bass loudspeakers only for lower frequencies, with some overlap possible, the crossover point of the system is below or in the lower end of the range of human voice (around 300 Hz to 4 kHz). This avoids having a discontinuity in directivity within the middle of the voice range, as may be the case when a crossover must be higher in the voice range, such as around 1-2 kHz. The ability to position the bass loudspeakers close to the horn loudspeakers and in a precisely controlled relative position further enhances the directivity transition at the crossover point and allows good phase and timing alignment over the full angular range.

Figure 13:
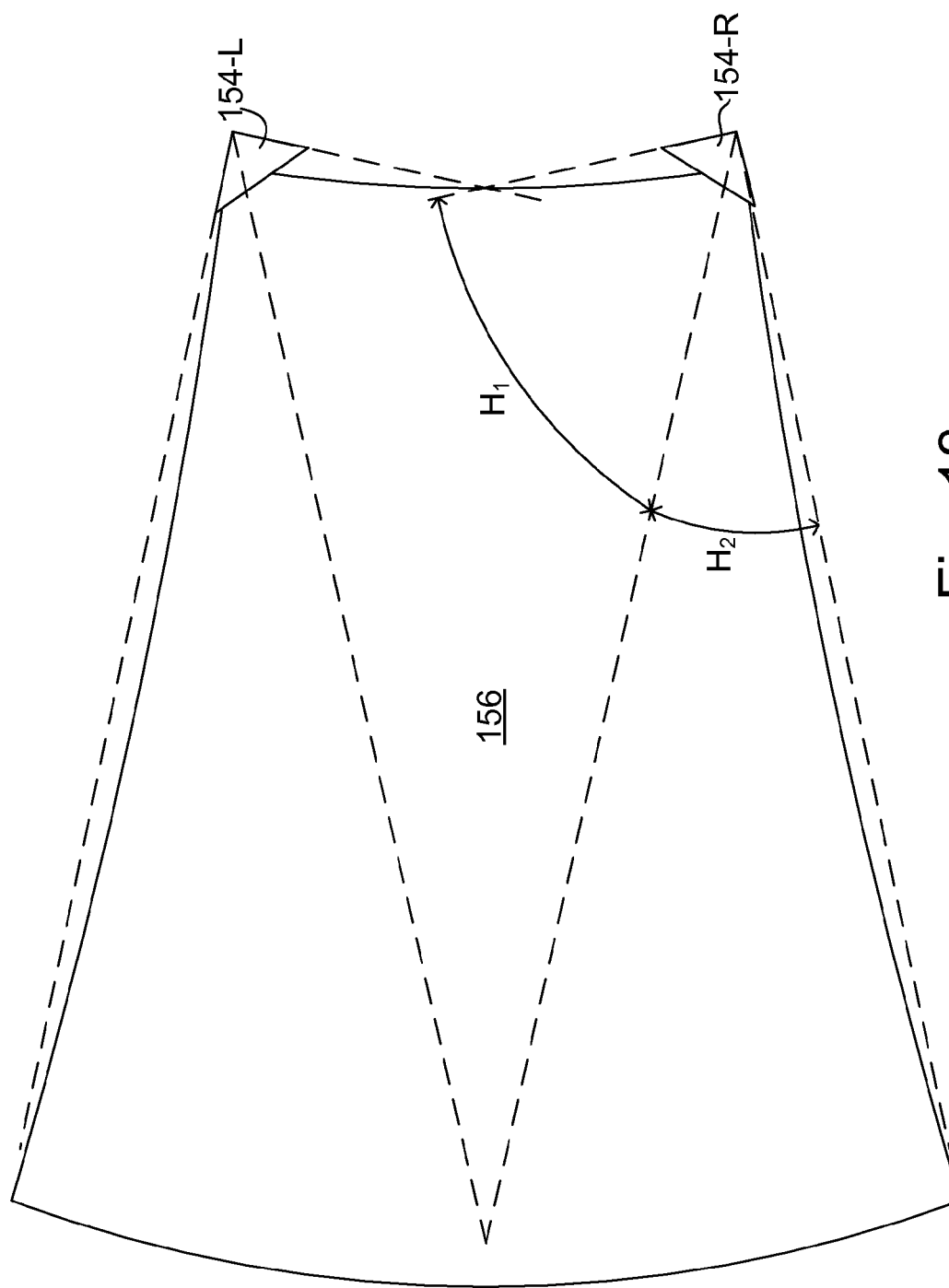
FIG. 13 shows a plan view of two loudspeakers in a venue.
Figure 14:
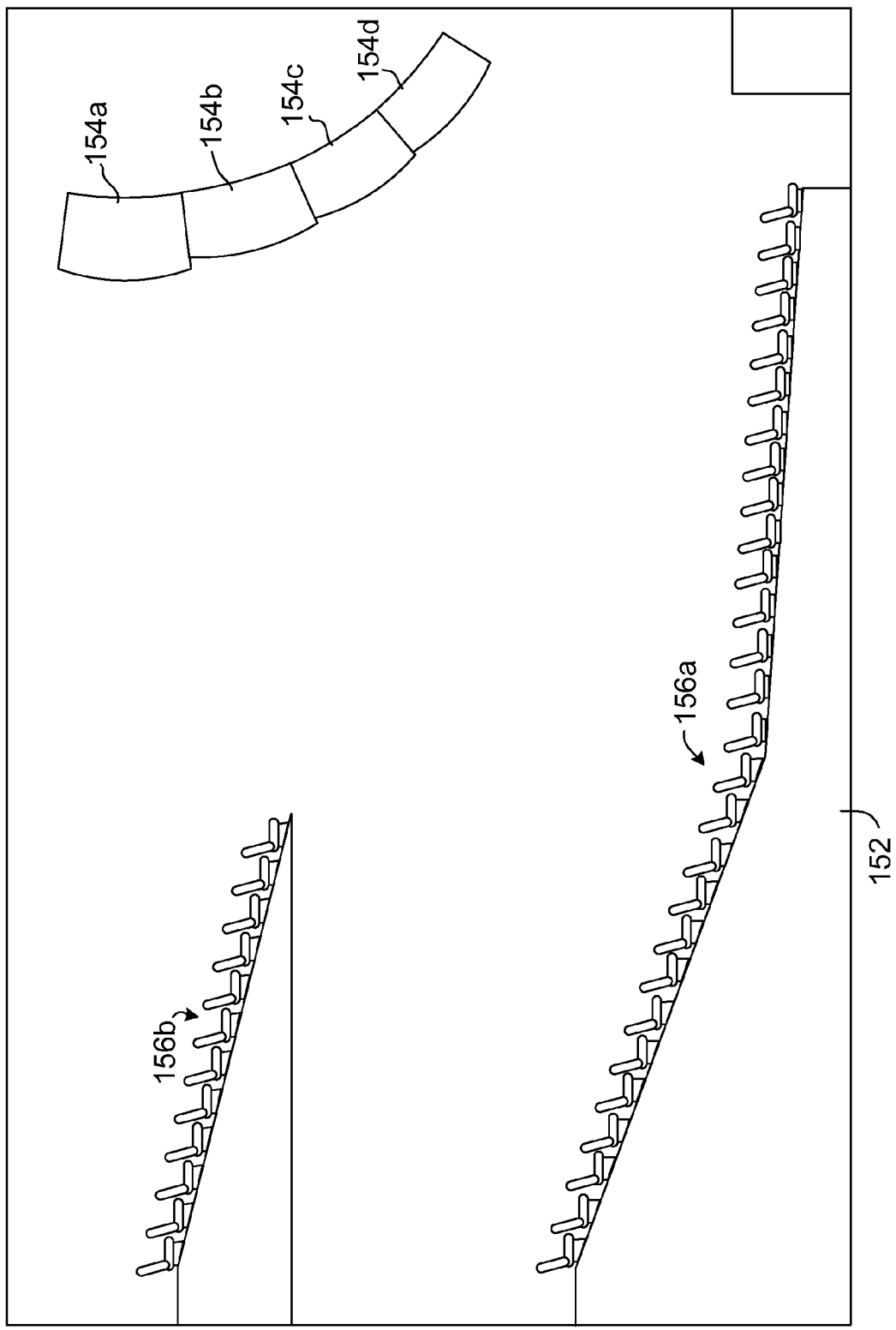
FIG. 14 shows a side elevation view of a loudspeaker array in a venue.

FIGS. 13 and 14 show two installation examples that combine several of the alternatives mentioned above. In FIG. 13, two asymmetric loudspeakers 154-L and 154-R are used, one on each side of the listening area 156. The inner side walls (the side walls facing the middle if the listening area) of the loudspeakers have a large horizontal angle $H_1$ to reach the front-center of the listening areas, while the outer side walls have narrow horizontal angles $H_2$ to confine the sound to the outer edge of the listening area with sufficient sharpness to reach the rear. The angles $H_1$ and $H_2$ are unequal because the diffraction slot is aimed at the rear-center of the listening area 156, rather than centered between the inner and outer walls of each horn, to provide even sound coverage. As in the other figures, axes are not to scale and the angles and distances in FIG. 13 are exaggerated to show their differences.

In FIG. 14, a long array of loudspeakers 154a-154d is used to provide an extremely long diffraction slot for covering a large venue 152 with two listening areas 156a and 156b. The uppermost loudspeaker 154a reaches the back of the balcony 156b, while the lower three loudspeakers 154b-154d cover the lower floor 156a. In such a configuration, circular-arc modules of differing radius may be arrayed to achieve the effect of a long spiral array while using the simpler shapes of the circular-arc horn and keel.

Other implementations are within the scope of the following claims and other claims to which the applicant may be entitled.

What is claimed is:

1. A loudspeaker comprising:
a horn comprising a first end panel, a second end panel, a first side panel, and a second side panel, the first and second end panels and first and second side panels configured to form a narrow end of the horn and a flared end of the horn, and a first edge of at least the first and second side panels defining a diffraction slot opening positioned at the narrow end of the horn; and
a plurality of electro-acoustic transducers configured to be coupled to the diffraction slot opening,
wherein the first and second side panels each comprise a sheet of flexible material held in a stressed, curved shape by at least a rigid support member, the first edges of the side panels each being coupled to the rigid support member under tension, without fasteners along the length of the first edges, and at an angle that varies along the length of the first edges.

2. The loudspeaker of claim 1 wherein the first and second end panels each comprise a rigid sheet material.

3. The loudspeaker of claim 1 wherein the diffraction slot opening has a convex curvature relative to the inside of the horn.

4. The loudspeaker of claim 1 wherein the side panels are curved in a direction corresponding to the diffraction slot opening while remaining straight in a direction perpendicular to the slot opening.

5. The loudspeaker of claim 1 wherein the curved shapes of the first and second side panels each have dimensions corresponding to a section of a right circular conical surface.

6. The loudspeaker of claim 5 wherein the conical surface section is bounded by a first circular arc of a first radius, a second circular arc of a second radius, and straight edges collinear with lines on the conical surface that intersect an end of each of the first and second circular arcs and the apex of the cone.

7. The loudspeaker of claim 5 wherein the conical surface section is bounded by a first circular arc of a first radius, a second arc of a varying radius, and straight edges collinear with lines on the conical surface that intersect an end of each of the first and second arcs and the apex of the cone.

8. The loudspeaker of claim 1 wherein the first and second side panels have dimensions when flat corresponding to a section of a planar annulus defined by an inner radius, an outer radius, and an angle.

9. The loudspeaker of claim 1 wherein the first and second side panels each vary in length and curvature along the extent of the slot opening.

10. The loudspeaker of claim 1 wherein the plurality of electro-acoustic transducers are coupled to the diffraction slot opening via a plurality of manifold components, each manifold component having an output opening coupled to the diffraction slot opening, the output openings of the plurality of manifold components together constituting a diffraction slot source at the diffraction slot opening, wherein the plurality of electro-acoustic transducers are each coupled to an input opening of one of the manifold components.

11. The loudspeaker of claim 10 wherein:

the manifold components each have two input openings and comprise two acoustic passages, each of the acoustic passages having a first end at a different one of the two input openings and a second end at the output opening, and the acoustic passages each curving away from the output opening in a different direction, such that the input openings are located near opposite sides of the horn.

12. The loudspeaker of claim 10 wherein:

the manifold components each have one input opening and comprise one acoustic passage having a first end at the input opening and a second end at the output opening, the acoustic passage of each manifold component curving away from the output opening in a direction opposite that of the neighboring manifold components' acoustic passages, such that the input opening is located near the opposite side of the horn from the neighboring manifold components' input openings.

13. The loudspeaker of claim 1 wherein the plurality of electro-acoustic transducers are positioned along an arc.

14. The loudspeaker of claim 13 wherein the edges of the first and second side panels that define the diffraction slot opening have a curvature that corresponds to the shape of the arc.

15. The loudspeaker of claim 1 wherein the first and second end panels have a substantially flat shape.

16. The loudspeaker of claim 1 wherein at least one of the first and second end panels is asymmetric about at least one axis.

17. The loudspeaker of claim 1 wherein the first end panel has a first length and a first width and the second end panel has a second length and a second width, the first length being different from the second length and the first width being different from the second width.

18. The loudspeaker of claim 1 wherein at least one of the depth and width of the horn varies along the height of the horn.

\* \* \* \* \*